US012811574B2

(12) United States Patent
Lee et al.

(10) Patent No.: US 12,811,574 B2
(45) Date of Patent: Nov. 24, 2026

(54) BUFFER CIRCUIT HAVING ENHANCED SLEW RATE

(71) Applicant: Magnachip Semiconductor, Ltd., Cheongju-si (KR)

(72) Inventors: Sangho Lee, Cheongju-si (KR); Hyoungkyu Kim, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 159 days.

(21) Appl. No.: 18/459,916

(22) Filed: Sep. 1, 2023

(65) Prior Publication Data

US 2024/0313761 A1 Sep. 19, 2024

(30) Foreign Application Priority Data

Mar. 13, 2023 (KR) ........................ 10-2023-0032695

(51) Int. Cl.
*H03K 5/12* (2006.01)
*H03F 3/45* (2006.01)

(52) U.S. Cl.
CPC ........... *H03K 5/12* (2013.01); *H03F 3/45475* (2013.01); *H03F 2203/45248* (2013.01)

(58) Field of Classification Search
None
See application file for complete search history.

(56) References Cited

U.S. PATENT DOCUMENTS 9,543,912 B2 * 1/2017 Lee .......................... H03F 3/301
11,538,432 B2 * 12/2022 Jung ................ H03K 3/356113
11,711,059 B2 * 7/2023 Kim .......................... G09G 3/20 345/204
11,901,869 B2 * 2/2024 Kim ......................... H03F 1/523
11,955,090 B2 * 4/2024 Lee ....................... G09G 3/3275
2011/0298777 A1 * 12/2011 Tsuchi ................. G09G 3/3688 345/211
2024/0313705 A1 * 9/2024 Lee .......................... G09G 3/20

* cited by examiner

*Primary Examiner* — Thomas J. Hiltunen
(74) *Attorney, Agent, or Firm* — NSIP Law

(57) ABSTRACT

A buffer circuit that generates an output voltage based on an input voltage includes an input stage configured to provide a differential current to a load stage based on a difference between the input voltage and the output voltage; the load stage configured to apply gate voltages to output transistors of an output stage based on the differential current; the output stage configured to regulate the output voltage based on the gate voltages applied to the output transistors; and a slew rate compensator configured to provide a first slew rate compensation current and a second slew rate compensation current to the load stage or receive the first slew rate compensation current and the second slew rate compensation current from the load stage based on the difference between the input voltage and the output voltage.

19 Claims, 10 Drawing Sheets

BUFFER CIRCUIT HAVING ENHANCED SLEW RATE

CROSS REFERENCE TO RELATED APPLICATION

The present application claims the benefit under 35 USC § 119(a) of Korea Patent Application No. 10-2023-0032695, filed on Mar. 13, 2023, in the Korean Intellectual Property Office, the entire disclosure of which is incorporated herein by reference for all purposes.

BACKGROUND

1. Field

The following description relates to a buffer circuit with an improved slew rate, and more particularly, to a buffer circuit that simultaneously provides two slew rate compensation currents to an operational amplifier to achieve high slew rate and low power consumption.

2. Description of the Related Art

The driving frequency for driving the liquid panel of a liquid panel driving device increases as the resolution of the display increases. Accordingly, as the display frame time decreases, the slew rate of the buffer circuit becomes a critical factor, and power consumption can increase with a higher driving frequency.

In addition, it can also increase load capacitance, which has a significant impact on the slew rate and stability of the operational amplifier included in the liquid panel driving device.

Buffer circuits use operational amplifiers, and recently there has been an emphasis on operational amplifiers that operate at low power and low voltage to reduce power consumption.

The slew rate of an operational amplifier is the amount of change in the op amp's output voltage, VOUT, per unit time, and a high slew rate is required to operate at fast driving frequencies. In general, the slew rate may be obtained by dividing the bias current at the input stage of the operational amplifier by the compensation capacitance, so the slew rate can be increased by increasing the bias current at the input stage or decreasing the compensation capacitance. However, while increasing the bias current may improve the slew rate, it may also increase the static current, thereby increasing the power consumed by the operational amplifier.

Meanwhile, increasing the compensation capacitance may improve the stability of the operational amplifier. However, increasing the compensation capacitance also increases a layout area of the operational amplifier, which may decrease slew rate. Conversely, decreasing the compensation capacitance may decrease stability of the operational amplifier and that may cause the operational amplifier to oscillate, or to increase the settling time of the operational amplifier. As a result, there is a need for an operational amplifier having a lower static current, and providing a reduced power consumption, a faster slew rate, and better stability.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a buffer circuit that generates an output voltage based on an input voltage includes: an input stage configured to provide a differential current to a load stage based on a difference between the input voltage and the output voltage; the load stage configured to apply gate voltages to output transistors of an output stage based on the differential current; the output stage configured to regulate the output voltage based on the gate voltages applied to the output transistors; and a slew rate compensator configured to provide a first slew rate compensation current and a second slew rate compensation current to the load stage or receive the first slew rate compensation current and the second slew rate compensation current from the load stage based on the difference between the input voltage and the output voltage.

The slew rate compensator may include: a comparator configured to compare the difference between the input voltage and the output voltage and go into an ON or OFF state based on the difference between the input voltage and the output voltage; a first slew rate compensation circuit configured to provide the first slew rate compensation current and the second slew rate compensation current to the load stage based on the difference between the input voltage and the output voltage; and a second slew rate compensation circuit configured to receive the first slew rate compensation current and the second slew rate compensation current from the load stage based on the difference between the input voltage and the output voltage.

The first slew rate compensation circuit may include: a first slew rate compensation PMOS transistor connected to the comparator and configured to allow a first slew rate compensation reference current to flow therein; a second slew rate compensation PMOS transistor having a current mirror structure based on the first slew rate compensation PMOS transistor and configured to allow the second slew rate compensation current to flow therein; and a third slew rate compensation PMOS transistor having the current mirror structure based on the first slew rate compensation PMOS transistor, having a parallel structure with the second slew rate compensation PMOS transistor, and configured to allow the first slew rate compensation current to flow therein.

The first slew rate compensation PMOS transistor may have a gate connected to the comparator, a drain connected to the comparator in common with the gate, and a source receiving a power supply voltage; the second slew rate compensation PMOS transistor may have a gate connected to the comparator in common with the gate of the first slew rate compensation PMOS transistor, a drain connected to a third node of a third output terminal of a second differential mirror circuit of the load stage, and a source connected to the power supply voltage, and the third slew rate compensation PMOS transistor may have a gate connected to the comparator in common with the gate of the first slew rate compensation PMOS transistor, a drain connected to a first node of a first output terminal of a first differential mirror circuit of the load stage, and a source connected to the power supply voltage.

The first slew rate compensation circuit may mirror the first slew rate compensation reference current flowing in a branch to which the first slew rate compensation PMOS transistor is connected into a branch to which the third slew rate compensation PMOS transistor is connected to provide the first slew rate compensation current to the load stage, and the first slew rate compensation circuit may mirror the first slew rate compensation reference current flowing in the branch to which the first slew rate compensation PMOS transistor is connected into a branch to which the second slew rate compensation PMOS transistor is connected to provide the second slew rate compensation current to the load stage.

The second slew rate compensation circuit may include: a first slew rate compensation NMOS transistor connected to the comparator and configured to allow a second slew rate compensation reference current to flow therein; a second slew rate compensation NMOS transistor having a current mirror structure based on the first slew rate compensation NMOS transistor and configured to allow the first slew rate compensation current to flow therein; and a third slew rate compensation NMOS transistor having the current mirror structure based on the first slew rate compensation NMOS transistor, having a parallel structure with the second slew rate compensation NMOS transistor, and configured to allow the second slew rate compensation current to flow therein.

The first slew rate compensation NMOS transistor may have a gate connected to the comparator, a drain connected to the comparator in common with the gate, and a source connected to a ground voltage, the second slew rate compensation NMOS transistor may have a gate connected to the comparator in common with the gate of the first slew rate compensation NMOS transistor, a drain connected to a first node of a first output terminal of a first differential mirror circuit of the load stage, and a source connected to the ground voltage, and the third slew rate compensation NMOS transistor may have a gate connected to the comparator in common with the gate of the first slew rate compensation NMOS transistor, a drain connected to a third node of a third output terminal of a second differential mirror circuit of the load stage, and a source connected to the ground voltage.

The second slew rate compensation circuit may mirror the second slew rate compensation reference current flowing in a branch to which the first slew rate compensation NMOS transistor is connected into a branch to which the second slew rate compensation NMOS transistor is connected to receive the first slew rate compensation current from the load stage, and the second slew rate compensation circuit may mirror the second slew rate compensation reference current flowing in the branch to which the first slew rate compensation NMOS transistor is connected into a branch to which the third slew rate compensation NMOS transistor is connected to receive the second slew rate compensation current from the load stage.

The comparator may include: a first comparator including an NMOS transistor having a gate connected to the input voltage, a drain connected to the first slew rate compensation circuit, and a source connected to the output voltage; and a second comparator including a PMOS transistor having a gate connected to the input voltage, a drain connected to the second slew rate compensation circuit, and a source connected to the output voltage, and the NMOS transistor of the first comparator may have a body connected to the output voltage in common with the sources of the first comparator and the second comparator.

The load stage may include: a first differential mirror circuit having a first current mirror structure and a cascode structure and configured to mirror the differential current generated by the difference between the input voltage and the output voltage and the first slew rate compensation current; a second differential mirror circuit having a second current mirror structure and a cascode structure and configured to mirror the differential current and the second slew rate compensation current; and a third bias circuit and a fourth bias circuit connected between the first differential mirror circuit and the second differential mirror circuit to control an operation in a static state and an amplification operation of the first differential mirror circuit and the second differential mirror circuit.

The first differential mirror circuit may include: first and second load stage PMOS transistors configured to perform a current mirroring operation, and third and fourth load stage PMOS transistors connected in series to the first and second load stage PMOS transistors, respectively, to form a cascode structure, and the first load stage PMOS transistor may have a gate connected to the third bias circuit in common with a gate of the second load stage PMOS transistor, a drain connected to a first output terminal where a first node is located, and a source connected to a power supply voltage, the second load stage PMOS transistor may have a gate connected to the third bias circuit in common with the gate of the first load stage PMOS transistor, a drain connected to a second output terminal where a second node is located, and a source connected to the power supply voltage, the third load stage PMOS transistor may have a gate connected between the third bias circuit and the first load stage PMOS transistor and connected to a third bias voltage, a drain connected to the third bias circuit, and a source connected to the first output terminal where the first node is located, and the fourth load stage PMOS transistor may have a gate connected between the fourth bias circuit and the second load stage PMOS transistor and connected to the third bias voltage, a drain connected to the fourth bias circuit, and a source connected to the second output terminal where the second node is located.

The first differential mirror circuit may be configured to receive the first slew rate compensation current at the first node from the slew rate compensator or provide the first slew rate compensation current from the first node to the slew rate compensator.

The second differential mirror circuit may include: first and second load stage NMOS transistors configured to perform a current mirroring operation, and third and fourth load stage NMOS transistors connected in series to the first and second load stage NMOS transistors, respectively, to form a cascode structure. The first load stage NMOS transistor may have a gate connected to the third bias circuit in common with the second load stage NMOS transistor, a drain connected to a third output terminal where a third node is located, and a source connected to a ground voltage, the second load stage NMOS transistor may have a gate connected to the third bias circuit in common with the first load stage NMOS transistor, a drain connected to a fourth output terminal where a fourth node is located, and a source connected to the ground voltage, the third load stage NMOS transistor may have a gate connected to a fourth bias voltage, a drain connected to the third bias circuit, and a source connected to the third output terminal where the third node is located, and the fourth load stage NMOS transistor may have a gate connected to the fourth bias voltage, a drain connected to the fourth bias circuit, and a source connected to the fourth output terminal where the fourth node is located.

The second differential mirror circuit may be configured to receive the second slew rate compensation current at the third node from the slew rate compensator, or may provide the second slew rate compensation current from the third node to the slew rate compensator.

In another general aspect, a buffer circuit may generate an output voltage based on an input voltage. The buffer circuit may include an input stage configured to provide a differential current to a load stage based on a difference between the input voltage and the output voltage; the load stage configured to apply gate voltages to output transistors of an output stage based on the differential current; the output stage configured to regulate the output voltage based on the gate voltages applied to the output transistors; and a slew rate compensator configured to provide to or receive from the load stage a first slew rate compensation current and a second slew rate compensation current based on the difference between the input voltage and the output voltage, and the slew rate compensator may further include a first comparator having a body connected to the output voltage in common with a source, and a second comparator connected to the first comparator.

The slew rate compensator may include: a first slew rate compensation circuit configured to provide the first slew rate compensation current and the second slew rate compensation current to the load stage; and a second slew rate compensation circuit configured to receive the first slew rate compensation current and the second slew rate compensation current from the load stage.

The first comparator may include an NMOS transistor having a gate connected to the input voltage, a drain connected to the first slew rate compensation circuit, and a source connected to the output voltage, and the second comparator may include a PMOS transistor having a gate connected to the input voltage, a drain connected to the second slew rate compensation circuit, and a source connected to the output voltage.

In another general aspect, a method of controlling a buffer circuit may include: comparing an input voltage and an output voltage of the buffer circuit; providing or receiving a first slew rate compensation current and a second slew rate compensation current to or from a load stage of the buffer circuit in response to a difference between the input and output voltages exceeding a threshold voltage of a MOS transistor; flowing a first compensation mirror current and a second compensation mirror current through a first differential mirror circuit and a second differential mirror circuit of the load stage based on the first slew rate compensation current and the second slew rate compensation current; increasing or decreasing gate voltages of a first output transistor and a second output transistor of an output stage of the buffer circuit based on the first compensation mirror current and the second compensation mirror current; and allowing the output voltage to follow a rising or falling transition of the input voltage based on an increase or decrease in the gate voltages of the first output transistor and the second output transistor.

The method of controlling a buffer circuit may further include: providing the first and second slew rate compensation currents to the load stage in response to the input voltage exceeding a value obtained by adding the threshold voltage of the MOS transistor to the output voltage; switching the first differential mirror circuit to an OFF state so that the first compensation mirror current does not flow, and switching the second differential mirror circuit to an ON state so that the second compensation mirror current flows based on the first slew rate compensation current and the second slew rate compensation current; decreasing the gate voltages of the first and second output transistors based on the first compensation mirror current and the second compensation mirror current; and allowing the output voltage to increase and follow a rising transition of the input voltage in response to a decrease in the gate voltages of the first and second output transistors.

The method of controlling a buffer circuit may further include: receiving the first slew rate compensation current and the second slew rate compensation current from the load stage when the input voltage becomes lower than a value obtained by subtracting the threshold voltage of the MOS transistor from the output voltage; switching the first differential mirror circuit to an ON state so that the first compensation mirror current flows, and switching the second differential mirror circuit to an OFF state so that the second compensation mirror current does not flow based on the first slew rate compensation current and the second slew rate compensation current; increasing the gate voltages of the first and second output transistors based on the first compensation mirror current and the second compensation mirror current; and allowing the output voltage to decrease and follow a falling transition of the input voltage in response to an increase in the gate voltages of the first and second output transistors.

According to one or more embodiments of the present disclosure, it is possible to provide a buffer circuit having a high slew rate, decreasing a layout area, and consuming less power.

In addition, it is possible to provide a buffer circuit that generates two compensation currents and to provide them to a load stage at the same time, or is provided with two compensation currents from a load stage to increase or decrease gate voltages of the first and second transistors of the output stage simultaneously such that an output voltage follows an input voltage, thereby the buffer circuit has a high slew rate.

In addition, instead of directly providing a compensation current to an output transistor or a compensation capacitor, a degree of improvement of the slew rate may be increased by indirectly providing the compensation current obtained by mirroring, which is less affected by a process or temperature change.

The effects that may be obtained in the present disclosure are not limited to the effects mentioned above, and other features and aspects will be apparent from the following detailed description, the drawings and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
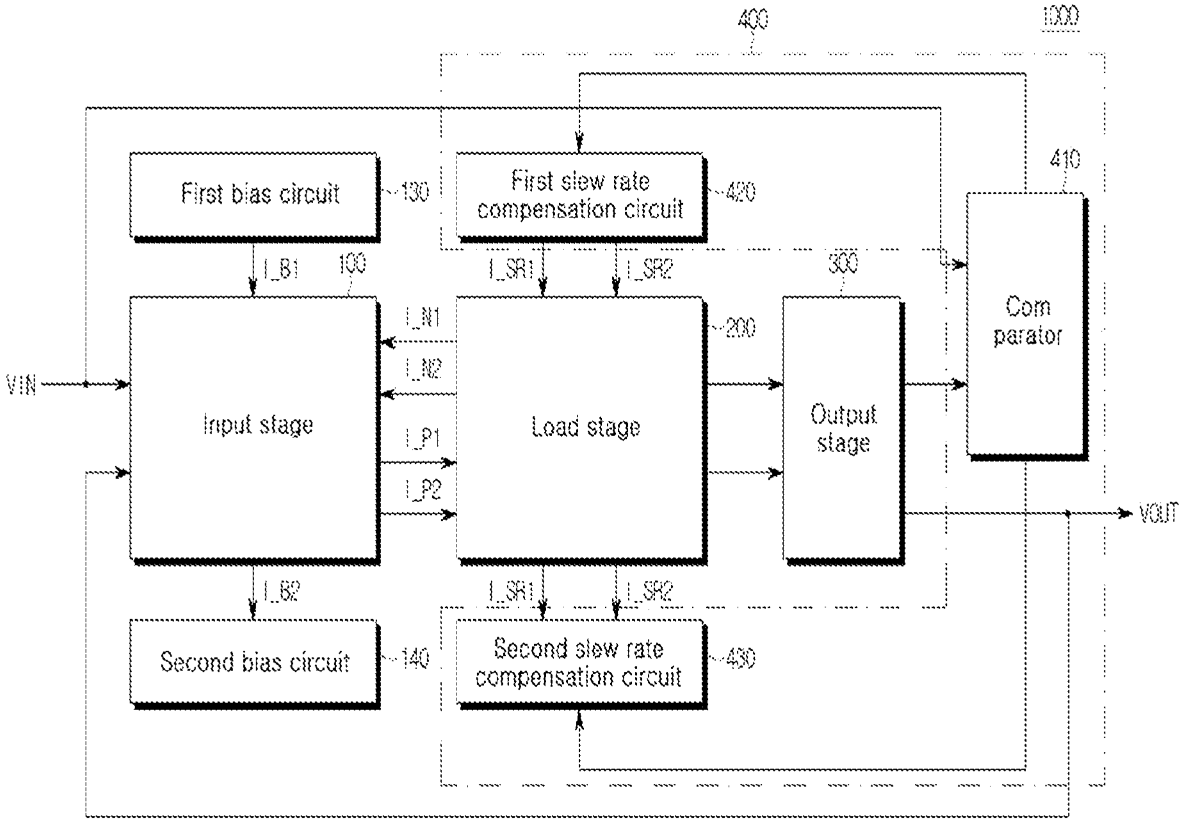
FIG. 1 illustrates a block diagram showing a buffer circuit according to one or more embodiments of the present disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application. Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items. Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Although the terms including an ordinal number such as first, second, etc. may be used for describing various elements, the structural elements are not restricted by the terms. The terms are only used to distinguish one element from another element.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof. Due to manufacturing techniques and/or tolerances, variations of the shapes shown in the drawings may occur. Thus, the examples described herein are not limited to the specific shapes shown in the drawings, but include changes in shape that occur during manufacturing. The features of the examples described herein may be combined in various ways as will be apparent after an understanding of the disclosure of this application. Further, although the examples described herein have a variety of configurations, other configurations are possible as will be apparent after an understanding of the disclosure of this application.

A term "part" or "module" used in the embodiments may mean software components or hardware components such as a field programmable gate array (FPGA), an application specific integrated circuit (ASIC). The "part" or "module" performs certain functions. However, the "part" or "module" is not meant to be limited to software or hardware. The "part" or "module" may be configured to be placed in an addressable storage medium or to restore one or more processors. Thus, for one example, the "part" or "module" may include components such as software components, object-oriented software components, class components, and task components, and may include processes, functions, attributes, procedures, subroutines, segments of a program code, drivers, firmware, microcode, circuits, data, databases, data structures, tables, arrays, and variables. Components and functions provided in the "part" or "module" may be combined with a smaller number of components and "parts" or "modules" or may be further divided into additional components and "parts" or "modules".

Methods or algorithm steps described relative to some embodiments of the present disclosure may be directly implemented by hardware and software modules that are executed by a processor or may be directly implemented by a combination thereof. The software module may be resident on a RAM, a flash memory, a ROM, an EPROM, an EEPROM, a resistor, a hard disk, a removable disk, a CD-ROM, or any other type of record medium known to those skilled in the art. An exemplary record medium is coupled to a processor and the processor can read information from the record medium and can record the information in a storage medium. In another way, the record medium may be integrally formed with the processor. The processor and the storage medium may reside in an application specific integrated circuit (ASIC). The ASIC may be resident within a user's terminal.

Hereinafter, a detailed description will be given as to the embodiments of the present disclosure with reference to the accompanying drawings in order for those skilled in the art to embody the present disclosure with ease. But the present disclosure is susceptible to variations and modifications and not limited to the embodiments described herein.

Figure 2:
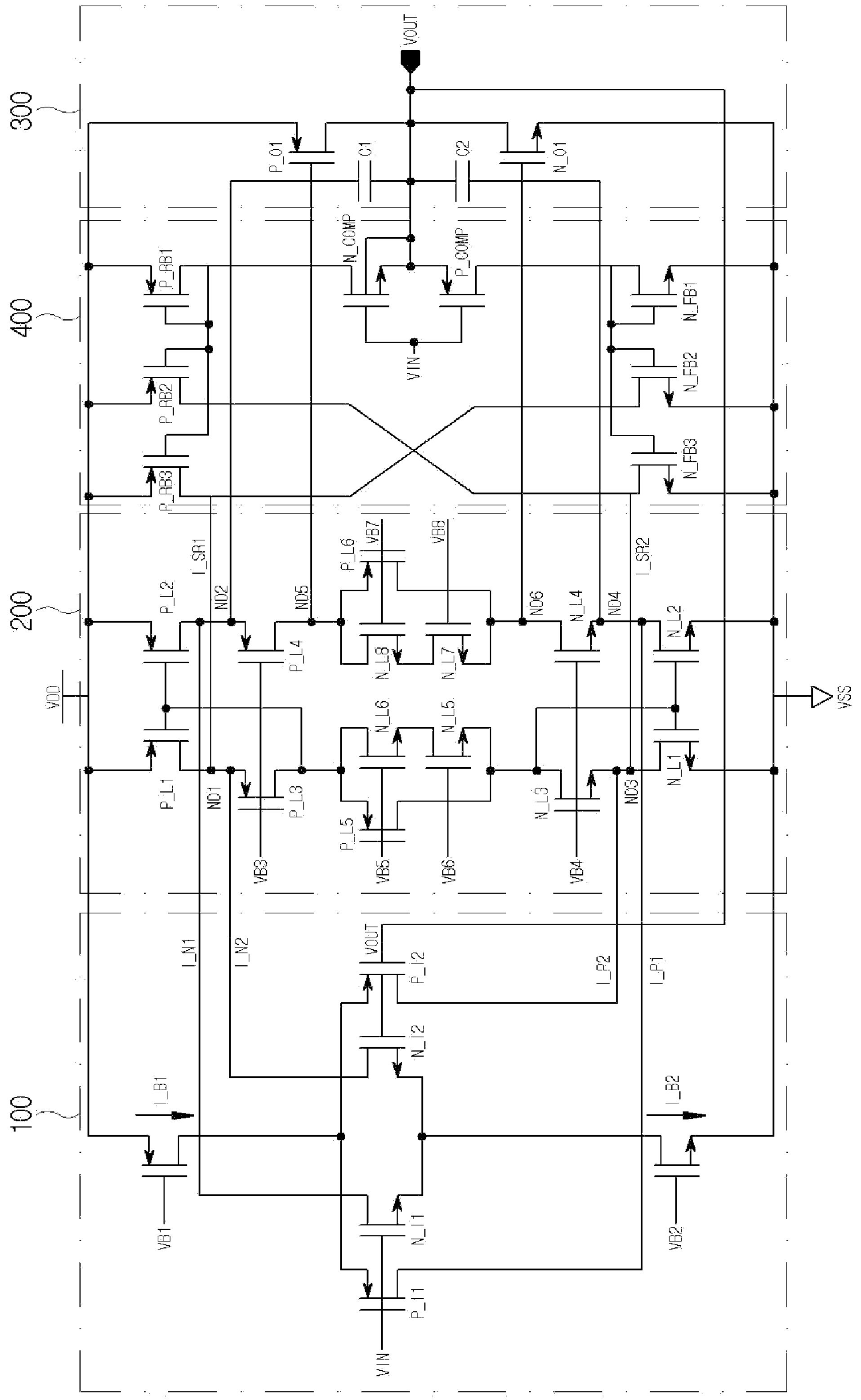
FIG. 2 illustrates a circuit diagram showing a buffer circuit according to one or more embodiments of the present disclosure.
Figure 3:
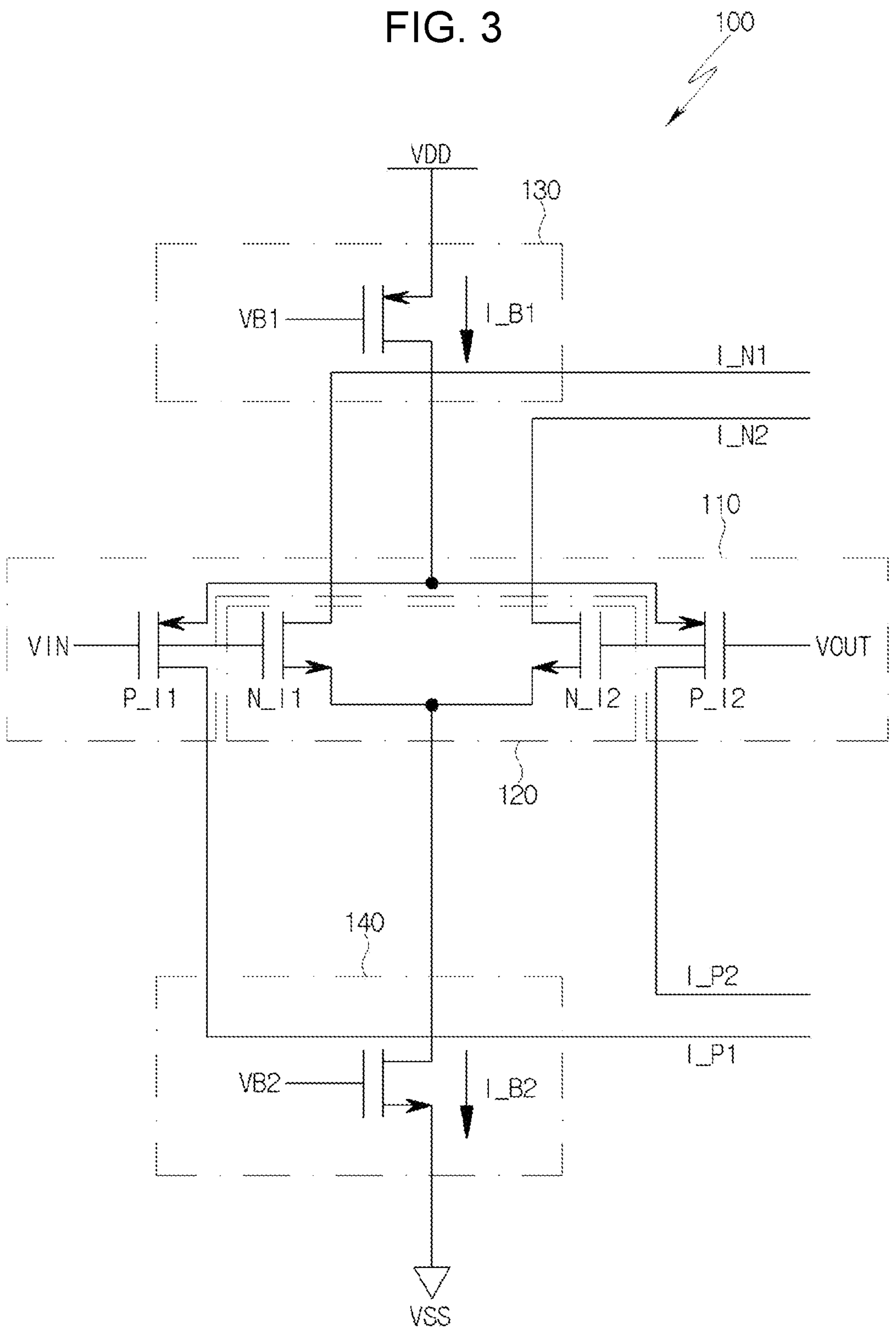
FIG. 3 illustrates a circuit diagram showing first and second bias circuits and an input stage according to one or more embodiments of the present disclosure.
Figure 4A:
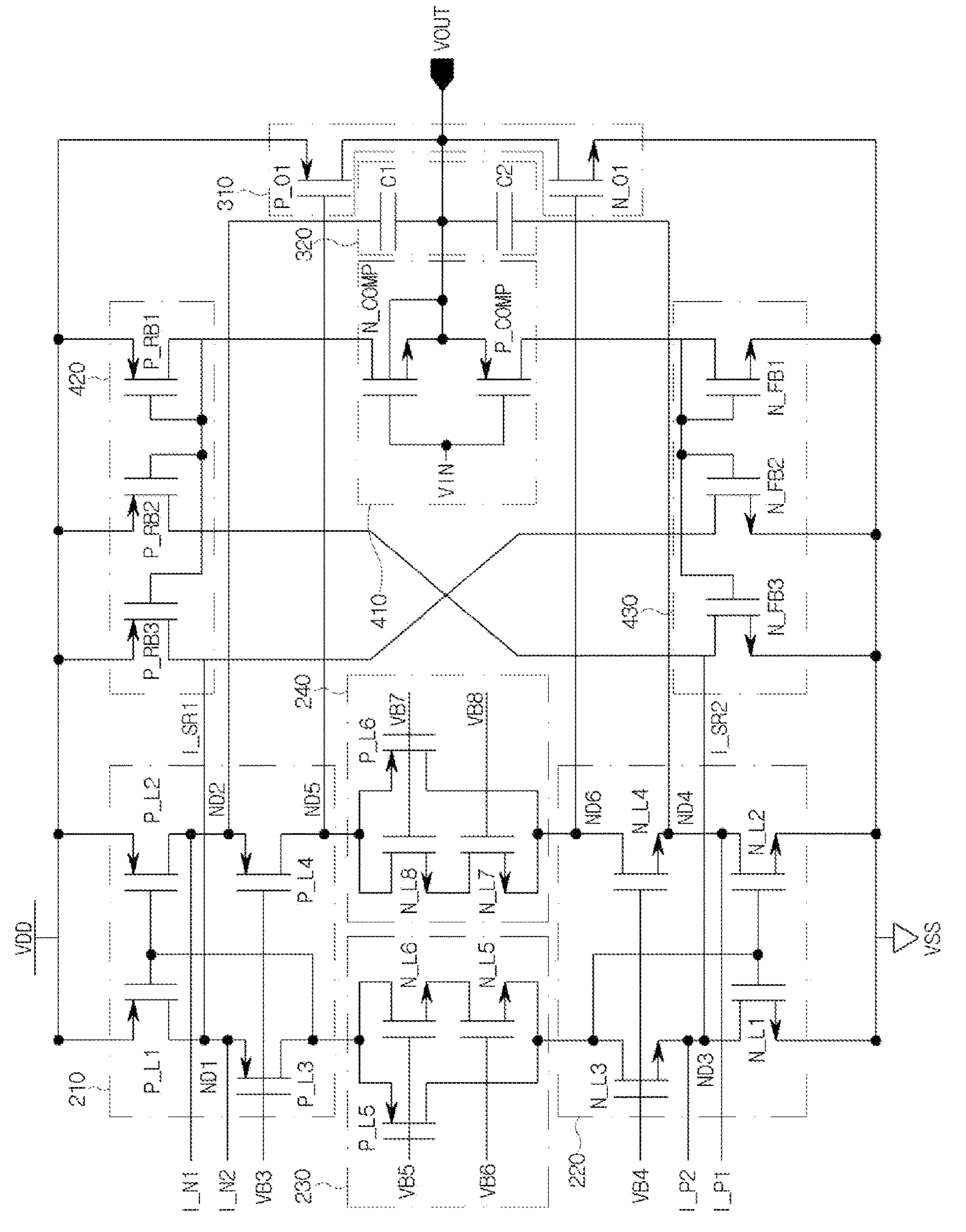
FIGS. 4A and 4B illustrate circuit diagrams showing a load stage, an output stage, and a slew rate compensator according to one or more embodiments of the present disclosure.
Figure 4B:
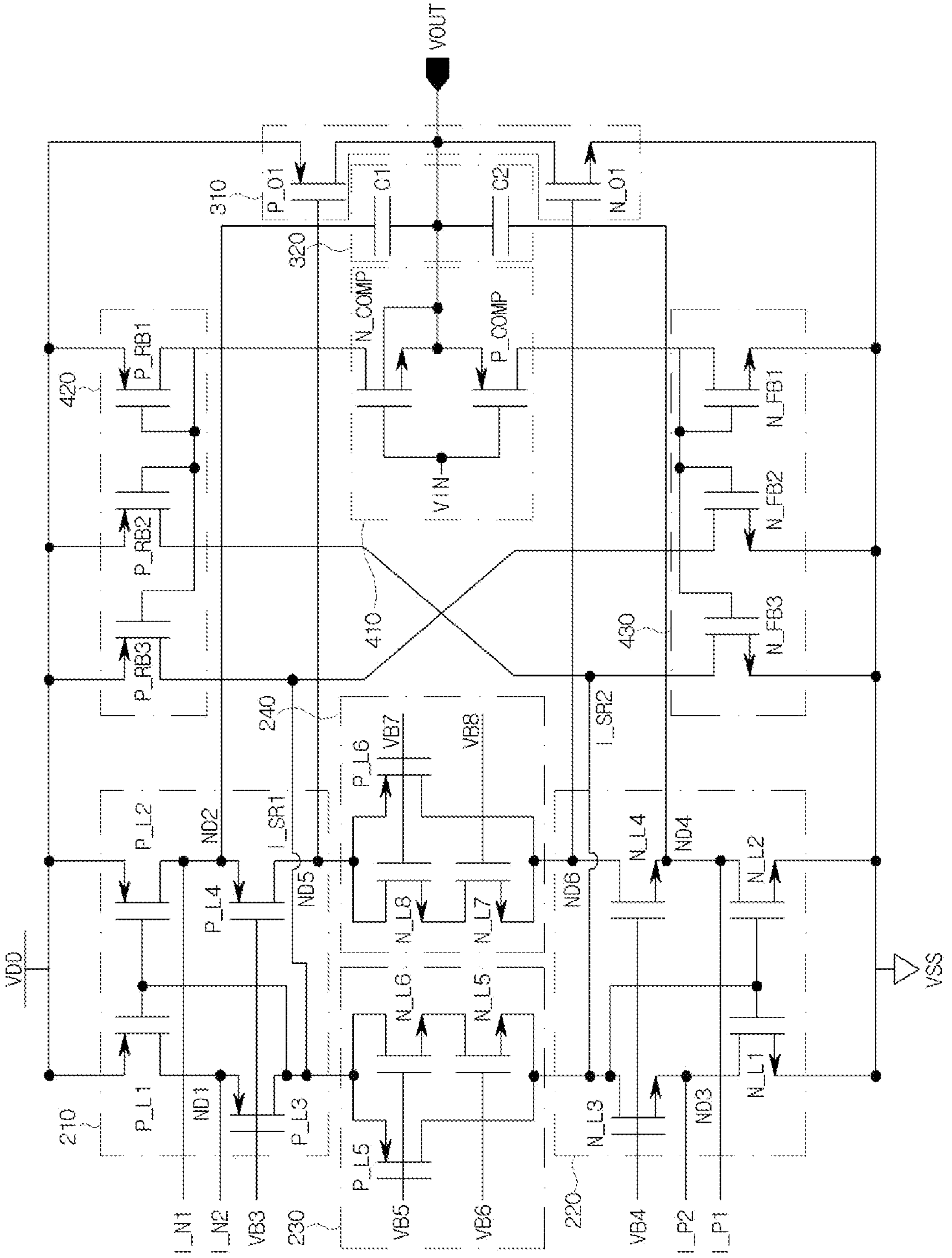
Figure 5A:
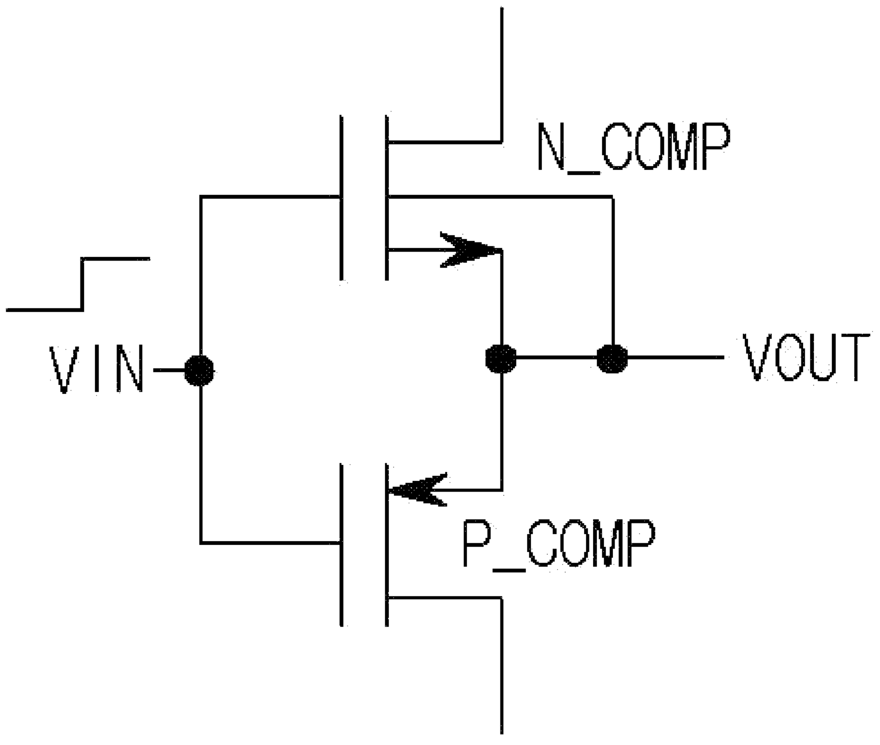
FIG. 5A illustrates a circuit diagram showing a comparator according to one or more embodiments of the present disclosure.
Figure 5B:
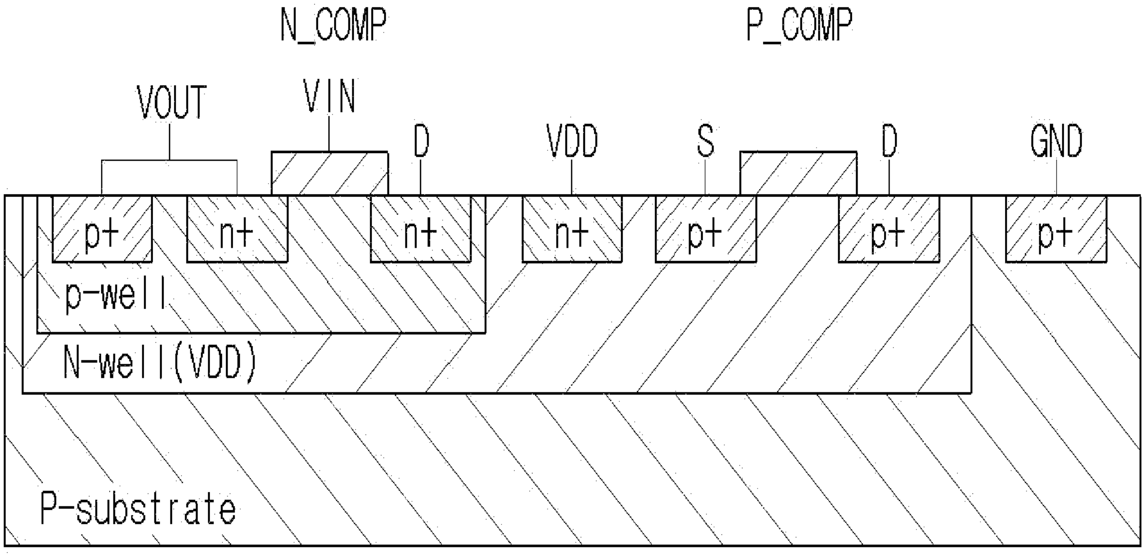
FIG. 5B illustrates a diagram showing the structure of a comparator according to one or more embodiments of the present disclosure.

FIG. 1 illustrates a block diagram showing a buffer circuit according to one or more embodiments of the present disclosure. In the following embodiments, detailed structures of components shown in FIG. 1 will be described with reference to FIGS. 2 to 5. FIG. 2 illustrates a circuit diagram showing a buffer circuit according to one or more embodiments of the present disclosure, FIG. 3 illustrates a circuit diagram showing first and second bias circuits and an input stage according to one or more embodiments of the present disclosure, FIGS. 4A and 4B illustrate circuit diagrams showing a load stage, an output stage, and a slew rate compensator according to one or more embodiments of the present disclosure, and FIG. 5A illustrates a circuit diagram showing a comparator according to one or more embodiments of the present disclosure, FIG. 5B illustrates a diagram showing the structure of a comparator according to one or more embodiments of the present disclosure.

Referring to FIG. 1, a buffer circuit 1000, in an example, may include an input stage 100, a load stage 200, and an output stage 300, and a slew rate compensator 400. The buffer circuit 1000 amplifies an input voltage VIN to output an output voltage VOUT. The buffer circuit 1000 may compare the output voltage VOUT with the input voltage VIN by providing feedback, and regulate the output voltage VOUT based on a difference between the input voltage VIN and the output voltage VOUT. The buffer circuit 1000 may improve the slew rate so that the output voltage VOUT quickly follows the input voltage VIN with respect to a rising transition of the input voltage VIN. In addition, the buffer circuit 1000 may improve the slew rate so that the output voltage VOUT can quickly follow the input voltage VIN with respect to a falling transition of the input voltage VIN.

The input stage 100 may deliver, to the load stage 200, first and second differential currents I_P1 and I_P2 based on a difference between the input voltage VIN and the output voltage VOUT feedback from the output stage 300. In addition, the input stage 100 may be delivered with third and fourth differential currents I_N1 and I_N2 from the load stage 200 based on a difference between the input voltage VIN and the output voltage VOUT feedback from the output stage 300. Here, a sum of the first and second differential currents I_P1 and I_P2 and a sum of the third and fourth differential currents I_N1 and I_N2 may be equal to each other. For example, when the input voltage VIN is higher than the output voltage VOUT, a second differential current I_P2 and a third differential current I_N1 increase, and a first differential current I_P1 and a fourth differential current I_N2 decreases so that the sum of the first and second differential currents I_P1 and I_P2 and the sum of the third and fourth differential currents I_N1 and I_N2 may be equal to each other.

The input stage 100 may have a rail-to-rail structure that includes double input stages. The input stage 100 may be connected between a power supply voltage and a ground voltage.

In an example, the input stage 100 may be connected to a first bias circuit 130. The input stage 100 may receive a first bias current I_B1 for operating an internal PMOS transistor from the first bias circuit 130. Here, the first bias current I_B1 may serve as a constant current source to allow constant first and second differential currents I_P1 and I_P2 to flow in the PMOS transistor inside the input stage 100.

The input stage 100 may be connected to the second bias circuit 140. The input stage 100 may provide a second bias current I_B2 to the second bias circuit 140 so that the internal NMOS transistor operates. Here, the second bias current I_B2 may serve as a constant current source to allow constant third and fourth differential currents I_N1 and I_N2 to flow in the NMOS transistor inside the input stage 100.

The first bias circuit 130 may be disposed between a power supply voltage VDD and the input stage 100. The first bias circuit 130 may be connected to the power supply voltage VDD and the input stage 100. The first bias circuit 130 may provide the first bias current I_B1 to the input stage 100 as a constant current source.

The second bias circuit 140 may be disposed between a ground voltage VSS and the input stage 100. The second bias circuit 140 may be connected to the ground voltage VSS and the input stage 100. The second bias circuit 140 may receive the second bias current I_B2 from the input stage 100 as a constant current source.

In an example, the load stage 200 may receive the first and second differential currents I_P1 and I_P2 from the input stage 100. The load stage 200 may provide the third and fourth differential currents I_N1 and I_N2 to the input stage 100. The load stage 200 may receive the first and second differential currents I_P1 and I_P2 from the input stage 100 based on the difference between the input voltage VIN and the output voltage VOUT. The load stage 200 may provide the third and fourth differential currents I_N1 and I_N2 to the input stage 100 based on the difference between the input voltage VIN and the output voltage VOUT.

The load stage 200 may increase or decrease the gate voltages of the output transistors of the output stage 300 based on the first to fourth differential currents I_P1, I_P2, I_N1, and I_N2. The load stage 200 may perform a current mirroring operation based on the first to fourth differential currents I_P1, I_P2, I_N1, and I_N2, and let the current flow into nodes connected to gate terminals of the output transistors of the output stage 300, or let the current flow out of the nodes. When the current flows into nodes connected to the gate terminals of the output transistors of the output stage 300, the gate voltages of the output transistors may increase. On the other hand, when the current flows out of the nodes connected to the gate terminals of the output transistors, the gate voltages of the output transistors may decrease. When the gate voltages of the output transistors increase, the output voltage VOUT may decrease. On the other hand, when the gate voltages of the output transistors decrease, the output voltage VOUT may increase.

The load stage 200 may receive the first and second slew rate compensation currents I_SR1 and I_SR2 from a first slew rate compensation circuit 420 when the input voltage VIN has a rising transition. The load stage 200 may generate a second compensation mirror current obtained by mirroring a reference current based on the received first and second slew rate compensation currents I_SR1 and I_SR2. The load stage 200 may instantaneously reduce the voltages of the nodes connected to the gate terminals of the output transistors of the output stage 300 by a second compensation mirror current. Accordingly, the gate voltages of the output transistors of the output stage 300 may decrease and the output voltage VOUT may increase.

The load stage 200 may provide the first and second slew rate compensation currents I_SR1 and I_SR2 to a second slew rate compensation circuit 430 when the input voltage VIN has a falling transition. The load stage 200 may generate a first compensation mirror current obtained by mirroring the reference current based on the provided first and second slew rate compensation currents I_SR1 and I_SR2. The load stage 200 may instantaneously increase voltages of the nodes connected to the gate terminals of the output transistors of the output stage 300 by the first compensation mirror current. Accordingly, the gate voltages of the output transistors of the output stage 300 may increase and the output voltage VOUT may decrease.

In the output stage 300, the gate voltages of the output transistors of the output stage 300 may increase or decrease while voltages of the nodes connected to the load stage 200 increase or decrease. When the gate voltages of the output transistors of the output stage 300 increase, the output voltage VOUT of the output stage 300 may decrease. On the other hand, when the gate voltages of the output transistors of the output stage 300 decrease, the output voltage VOUT of the output stage 300 may increase.

The slew rate compensator 400 may include a comparator 410, the first slew rate compensation circuit 420 and the second slew rate compensation circuit 430. The comparator 410 of the slew rate compensator 400 may compare the input voltage VIN with the output voltage VOUT. When the input voltage VIN exceeds a value obtained by adding a threshold voltage of the comparator 410 to the output voltage VOUT due to the rising transition of the input voltage VIN, the slew rate compensator 400 may activate the first slew rate compensation circuit 420 and inactivate the second slew rate compensation circuit 430. When the first slew rate compensation circuit 420 is activated, the first slew rate compensation circuit 420 may provide the first and second slew rate compensation currents I_SR1 and I_SR2 to the load stage 200. On the other hand, when the input voltage VIN falls below a value obtained by subtracting the threshold voltage of the comparator 410 from the output voltage VOUT due to the falling transition of the input voltage VIN, the slew rate compensator 400 may inactivate the first slew rate compensation circuit 420 and activate the second slew rate compensation circuit 430. When the second slew rate compensation circuit 430 is activated, the second slew rate compensation circuit 430 may receive the first and second slew rate compensation currents I_SR1 and I_SR2 from the load stage 200.

The following describes a detailed structure of the buffer circuit according to one or more embodiments of the present disclosure with reference to FIGS. 2 to 5.

Referring to FIGS. 2 and 3, the input stage 100 may include a first input stage 110 composed of PMOS transistors P_I1 and P_I2 and a second input stage 120 composed of NMOS transistors N_I1 and N_I2, a first bias circuit 130 providing the first bias current I_B1 to the first input stage 110, and the second bias circuit 140 receiving the second bias current I_B2 from the second input stage 120.

The first input stage 110 may include a first input stage PMOS transistor P_I1 and a second input stage PMOS transistor P_I2.

The first input stage PMOS transistor P_I1 may have a gate connected to the input voltage VIN, a source connected to the first bias circuit 130 in common with the second input stage PMOS transistor P_I2, and a drain connected to a fourth output terminal of a second differential mirror circuit 220. The first input stage PMOS transistor P_I1 may provide the first differential current I_P1 output based on the input voltage VIN to a fourth node ND4 connected to the fourth output terminal of the second differential mirror circuit 220 of the load stage 200.

The second input stage PMOS transistor P_I2 may have a gate connected to the output voltage VOUT, a source connected to the first bias circuit 130 in common with first input stage PMOS transistor P_I1, and a drain connected to a third output terminal of the second differential mirror circuit 220. The second input stage PMOS transistor P_I2 may provide the second differential current I_P2 output based on the input voltage VIN to a third node ND3 connected to the third output terminal of the second differential mirror circuit 220 of the load stage 200.

When the input voltage VIN and the output voltage VOUT are the same, the first differential current I_P1 and the second differential current I_P2 are provided to the load stage 200 with the same current value, and when there is a difference between the input voltage VIN and the output voltage VOUT, a difference is generated in the current values of the first differential current I_P1 and the second differential current I_P2 in proportion to the difference, and the first differential current I_P1 and the second differential current I_P2 are provided with the difference in the current values to the load stage 200.

In an example, when the input voltage VIN changes to 'L (e.g. VSS)' in a state where the input voltage VIN and the output voltage VOUT are identically 'H (e.g. VDD)', if the voltage between the gate and the source of the first input stage PMOS transistor P_I1, that is, a difference between the input voltage VIN and the power supply voltage VDD is greater than the threshold voltage, the first input stage PMOS transistor P_I1 is turned on, and a current flows, thus, the first differential current I_P1 has a value greater than zero. The first differential current I_P1 may further increase as the input voltage VIN decreases. In this case, the second differential current I_P2 may continue to be 0 during an interval in which the output voltage VOUT does not change at 'H'.

In another example, when the input voltage VIN changes to 'H' in a state where the input voltage VIN and the output voltage VOUT are 'L', as the voltage (the difference between the input voltage VIN and the power supply voltage VDD) between the gate and the source of the first input stage PMOS transistor P_I1 gradually decreases, the first differential current I_P1 also decreases accordingly, and when the voltage therebetween is smaller than the threshold voltage, the first differential current I_P1 becomes 0. In this case, the second differential current I_P2 may increase as much as the first differential current I_P1 decreases. This is because a sum of the first differential current I_P1 and the second differential current I_P2 is equal to the first bias current I_B1.

The second input stage 120 may include a first input stage NMOS transistor N_I1 and a second input stage NMOS transistor N_I2.

The first input stage NMOS transistor N_I1 may have a gate connected to the input voltage VIN, a source connected to the second bias circuit 140 in common with the second input stage NMOS transistor N_I2, and a drain connected to a second output terminal of a first differential mirror circuit 210. The first input stage NMOS transistor N_I1 may receive the third differential current I_N1 from a second node ND2 connected to the second output terminal of the first differential mirror circuit 210 of the load stage 200 based on the input voltage VIN.

The second input stage NMOS transistor N_I2 may have a gate connected to the output voltage VOUT, a source connected to the second bias circuit 140 in common with the first input stage NMOS transistor N_I1, and a drain connected to a first output terminal of the first differential mirror circuit 210 of the load stage 200. The second input stage NMOS transistor N_I2 may receive the fourth differential current I_N2 from a first node ND1 connected to the first output terminal of the first differential mirror circuit 210 of the load stage 200 based on the output voltage VOUT.

When the input voltage VIN and the output voltage VOUT are the same, the third differential current I_N1 and the fourth differential current I_N2 receive the same current value from the load stage 200, and when there is a difference between the input voltage VIN and the output voltage VOUT, a difference is generated in the current values of the third differential current I_N1 and the fourth differential current I_N2 in proportion to the difference. Accordingly, information about the difference between the input voltage VIN and the output voltage VOUT may be provided to the load stage 200.

In an example, when the input voltage VIN changes to 'H' in a state where the input voltage VIN and the output voltage VOUT are 'L', if the voltage (the difference between the input voltage VIN and the ground voltage VSS) between the gate and the source of the first input stage NMOS transistor N_I1 becomes greater than the threshold voltage, the first input stage NMOS transistor N_I1 is turned on and a current flows, and thus, the third differential current I_N1 has a value greater than 0. The third differential current I_N1 may be further increased as the input voltage VIN increases. In this case, the fourth differential current I_N2 may continue to be 0 during an interval in which the output voltage VOUT does not change at 'L'.

In another example, when the input voltage VIN changes to 'L' in a state where the input voltage VIN and the output voltage VOUT are 'H', as the voltage (the difference between the input voltage VIN and the ground voltage VSS) between the gate and the source of the first input stage NMOS transistor N_I1 gradually decreases, the third differential current I_N1 also decreases accordingly, and when the voltage therebetween is smaller than the threshold voltage, the third differential current I_N1 becomes 0. In this case, the fourth differential current I_N2 may increase as much as the third differential current I_N1 decreases. This is because a sum of the third differential current I_N1 and the fourth differential current I_N2 is equal to the second bias current I_B2.

Referring to FIGS. 2 and 4A, the load stage 200 may include the first differential mirror circuit 210, the second differential mirror circuit 220, a third bias circuit 230, and a fourth bias circuit 240.

Referring to FIGS. 4A and 4B, terminals that provide or receive a first slew rate compensation current I_SR1 and a second slew rate compensation current I_SR2 are different, while the remaining components are the same. FIG. 4A shows that the first slew rate compensation current I_SR1 is provided or received through the first node ND1 and the second slew rate compensation current I_SR2 is provided or received through the third node ND3. On the other hand, in FIG. 4B, the first slew rate compensation current I_SR1 is provided or received from a drain terminal of the third load stage PMOS transistor P_L3, and the second slew rate compensation current I_SR2 is provided or received from the drain terminal of the third load stage NMOS transistor N_L3. As such, FIGS. 4A and 4B are different only in terminals that provide or receive the first and second slew rate compensation currents I_SR1 and I_SR2, and the other components and operations are the same, thus the present disclosure mainly explains contents of the operation of FIG. 4A.

In an example, the first differential mirror circuit 210 has a cascode structure and may perform a current mirroring operation. In addition, the first differential mirror circuit 210 may serve as a constant current source, supply a current to the input stage 100, the third bias circuit 230 and the fourth bias circuit 240, and apply a voltage to a gate terminal of the first output transistor P_O1.

The first differential mirror circuit 210 may include the first load stage PMOS transistor P_L1 and the second load stage PMOS transistor P_L2 performing a current mirroring operation, and the third load stage PMOS transistor P_L3 and the fourth load stage PMOS transistor P_L4 connected in series to the first load stage PMOS transistor P_L1 and second load stage PMOS transistor P_L2, respectively, to form a cascode structure to have a high voltage gain.

Specifically, the first load stage PMOS transistor P_L1 of the first differential mirror circuit 210 may have a gate connected to the third bias circuit 230 in common with the second load stage PMOS transistor P_L2, a drain connected to the first output terminal where the first node ND1 is located, and a source connected to the power supply voltage VDD. Here, the first node ND1 located at the first output terminal is connected to the second input stage 120 to provide the fourth differential current I_N2 to the second input stage 120. In addition, the first node ND1 located at the first output terminal may be connected to a third slew rate compensation PMOS transistor P_RB3 of the first slew rate compensation circuit 420 of the slew rate compensator 400 to receive the first slew rate compensation current I_SR1, or, may be connected to the second slew rate compensation NMOS transistor N_FB2 of the second slew rate compensation circuit 430 to provide the first slew rate compensation current I_SR1.

The second load stage PMOS transistor P_L2 of the first differential mirror circuit 210 may have a gate connected to the third bias circuit 230 in common with the first load stage PMOS transistor P_L1, a drain connected to the second output terminal where the second node ND2 is located, and a source connected to the power supply voltage VDD.

Here, the second node ND2 located at the second output terminal is connected to the second input stage 120 to provide the third differential current I_N1 to the second input stage 120. Also, the second node ND2 located at the second output terminal may provide a current to a first compensation capacitor C1 of the output stage 300. In addition, as will be described later, a current obtained by mirroring a reference current flowing in a branch to which the first node ND1 is connected using a mirroring operation of the first differential mirror circuit 210 may flow through a branch to which the second node ND2 located at the second output terminal is connected. Here, the current obtained by mirroring the reference current may be referred to as a first compensation mirror current. When the first compensation mirror current flows from the second load stage PMOS transistor P_L2 to the second node ND2, a voltage of the second node ND2 may increase.

The third load stage PMOS transistor P_L3 of the first differential mirror circuit 210 may be connected between the third bias circuit 230 and the first load stage PMOS transistor P_L1. The third load stage PMOS transistor P_L3 may have a gate connected to the third bias voltage VB3, a drain connected to the third bias circuit 230, and a source connected to the first output terminal where the first node ND1 is located.

The fourth load stage PMOS transistor P_L4 of the first differential mirror circuit 210 may be connected between the fourth bias circuit 240 and the second load stage PMOS transistor P_L2. The fourth load stage PMOS transistor P_L4 may have a gate connected to the third bias voltage VB3, a drain connected to the fourth bias circuit 240, and a source connected to the second output terminal where the second node ND2 is located. A fifth node ND5 may be located at a point where the drain terminal of the fourth load stage PMOS transistor P_L4 and the fourth bias circuit 240 are connected.

Here, the fifth node ND5 may be connected to the first output transistor P_O1 of the output stage 300. The fifth node ND5 may be connected to the gate terminal of the first output transistor P_O1 of the output stage 300. The fifth node ND5 may receive a current through the second load stage PMOS transistor P_L2 and the fourth load stage PMOS transistor P_L4. The fifth node ND5 is connected to a sixth node ND6 through the fourth bias circuit 240 to provide a current.

In an example, when the fifth node ND5 receives a current through the second load stage PMOS transistor P_L2 and the fourth load stage PMOS transistor P_L4, a voltage of the fifth node ND5, that is, a gate voltage of the first output transistor P_O1 may increase.

In another example, when the fifth node ND5 does not receive a current from the second load stage PMOS transistor P_L2 and the fourth load stage PMOS transistor P_L4 and supplies a current to the fourth bias circuit 240, the voltage of the fifth node ND5, that is, the gate voltage of the first output transistor P_O1 may decrease.

The first differential mirror circuit 210 may mirror the reference current flowing in a branch to which the first load stage PMOS transistor P_L1 is connected into a branch connected to the second load stage PMOS transistor P_L2. Accordingly, the first compensation mirror current obtained by mirroring the reference current may flow in a branch to which the second load stage PMOS transistor P_L2 is connected.

In an example, the second differential mirror circuit 220 has a cascode structure and may perform a current mirroring operation. In addition, the second differential mirror circuit 220 serves as a constant current source, receives a current from the input stage 100, the third bias circuit 230, and the fourth bias circuit 240, and applies a voltage to a gate terminal of the second output transistor N_O1 of the output stage.

The second differential mirror circuit 220 may include the first and second load stage NMOS transistors N_L1 and N_L2 configured to perform a current mirroring operation, and the third and fourth load stage NMOS transistors N_L3 and N_L4 connected in series to the first and second load stage NMOS transistors N_L1 and N_L2 to form a cascode structure to have a high voltage gain.

Specifically, a first load stage NMOS transistor N_L1 of the second differential mirror circuit 220 may have a gate connected to the third bias circuit 230 in common with the second load stage NMOS transistor N_L2, a drain connected to the third output terminal where the third node ND3 is located, and a source connected to the ground voltage VSS. Here, the third node ND3 located at the third output terminal is connected to the first input stage 110 to receive the second differential current I_P2. In addition, the third node ND3 located at the third output terminal may be connected to a second slew rate compensation PMOS transistor P_RB2 of the first slew rate compensation circuit 420 of the slew rate compensator 400 to receive the second slew rate compensation current I_SR2, or may be connected to a third slew rate compensation NMOS transistor N_FB3 of the second slew rate compensation circuit 430 to provide the second slew rate compensation current I_SR2.

The second load stage NMOS transistor N_L2 of the second differential mirror circuit 220 may have a gate connected to the third bias circuit 230 in common with the first load stage NMOS transistor N_L1, a drain connected to the fourth output terminal where the fourth node ND4 is located, and a source connected to the ground voltage VSS.

In an example, the fourth node ND4 located at the fourth output terminal may be connected to the first input stage 110 to receive the first differential current I_P1. Also, the fourth node ND4 located at the fourth output terminal may provide a current to a second compensation capacitor C2 of the output stage 300. In addition, as will be described later, a current obtained by mirroring a reference current flowing in a branch to which the third node ND3 is connected using a mirroring operation of the second differential mirror circuit 220 may flow through a branch to which the fourth node ND4 located at the fourth output terminal is connected. Here, the current obtained by mirroring the reference current may be referred to as the second compensation mirror current. When the second compensation mirror current flows from the fourth node ND4 to the second load stage NMOS transistor N_L2, a voltage of the fourth node ND4 may decrease.

The third load stage NMOS transistor N_L3 of the second differential mirror circuit 220 may be connected between the third bias circuit 230 and the first load stage NMOS transistor N_L1. The third load stage NMOS transistor N_L3 may have a gate connected to the fourth bias voltage VB4, a drain connected to the third bias circuit 230, and a source connected to the third output terminal where the third node ND3 is located.

The fourth load stage NMOS transistor N_L4 of the second differential mirror circuit 220 may be connected between the fourth bias circuit 240 and the second load stage NMOS transistor N_L2. The fourth load stage NMOS transistor N_L4 may have a gate connected to the fourth bias voltage VB4, a drain connected to the fourth bias circuit 240, and a source connected to the fourth output terminal where the fourth node ND4 is located. The sixth node ND6 may be located at a point where the drain terminal of the fourth load stage NMOS transistor N_L4 and the fourth bias circuit 240 are connected.

Here, the sixth node ND6 may be connected to the second output transistor N_O1 of the output stage 300. The sixth node ND6 may be connected to a gate of the second output transistor N_O1 of the output stage 300. The sixth node ND6 may provide a current to the second load stage NMOS transistor N_L2 and the fourth load stage NMOS transistor N_L4. The sixth node ND6 is connected to the fourth node ND4 through the fourth bias circuit 240 to receive a current.

In an example, when the sixth node ND6 provides a current to the second load stage NMOS transistor N_L2 and the fourth load stage NMOS transistor N_L4, a voltage of the sixth node ND6, that is, a gate voltage of the second output transistor N_O1 may decrease.

In another example, when the sixth node ND6 does not provide a current to the second load stage NMOS transistor N_L2 and the fourth load stage NMOS transistor N_L4 and receives a current from the fourth bias circuit 240, the voltage of the sixth node ND6, that is, the gate voltage of the second output transistor N_O1 may increase.

The second differential mirror circuit 220 may mirror the reference current flowing in a branch to which the first load stage NMOS transistor N_L1 is connected into a branch connected to the second load stage NMOS transistor N_L2. Accordingly, the second compensation mirror current obtained by mirroring the reference current may flow in a branch to which the second load stage NMOS transistor N_L2 is connected.

The third bias circuit 230 may include a fifth load stage PMOS transistor P_L5 and a sixth load stage NMOS transistor N_L6 connected to a fifth bias voltage VB5, and a fifth load stage NMOS transistor N_L5 connected to a sixth bias voltage VB6. The third bias circuit 230 may be disposed between the first differential mirror circuit 210 and the second differential mirror circuit 220. The third bias circuit 230 may control an operation in a static state and an amplification operation of the first differential mirror circuit 210 and the second differential mirror circuit 220.

The fourth bias circuit 240 may include a sixth load stage PMOS transistor P_L6 and an eighth load stage NMOS transistor N_L8 connected to a seventh bias voltage VB7, and a seventh load stage NMOS transistor N_L7 connected to an eighth bias voltage VB8. The fourth bias circuit 240 may connect between the first differential mirror circuit 210 and the second differential mirror circuit 220. The fourth bias circuit 240 may control an operation in a static state and an amplification operation of the first differential mirror circuit 210 and the second differential mirror circuit 220. Also, the fourth bias circuit 240 is used as a floating current source and may regulate voltages of the fifth node ND5 and the sixth node ND6 by means of high impedance.

The slew rate compensator 400 may include the comparator 410, the first slew rate compensation circuit 420 and the second slew rate compensation circuit 430.

Referring to FIG. 5A, the comparator 410 may compare the input voltage VIN and the output voltage VOUT, and based on the difference between the input voltage VIN and the output voltage VOUT, may activate the first slew rate compensation circuit 420, or may activate the second slew rate compensation circuit 430. The comparator 410 may activate the first slew rate compensation circuit 420 when the input voltage VIN is greater than the output voltage VOUT. The comparator 410 may activate the second slew rate compensation circuit 430 when the output voltage VOUT is greater than the input voltage VIN.

The comparator 410 may include a first comparator N_COMP formed of an NMOS transistor and a second comparator P_COMP formed of a PMOS transistor.

The first comparator N_COMP may consist of a gate connected to the input voltage VIN, a drain directly connected to the first slew rate compensation circuit 420, and a source connected to the output voltage VOUT in common with the second comparator P_COMP.

The second comparator P_COMP may consist of a gate connected to the input voltage VIN, a drain directly connected to the second slew rate compensation circuit 430, and a source connected to the output voltage VOUT in common with the first comparator N_COMP.

In an example, when a magnitude of the input voltage VIN exceeds a value obtained by adding a threshold voltage of the NMOS transistor of the first comparator N_COMP to a magnitude of the output voltage VOUT, the first comparator N_COMP may go into an ON state, and the second comparator P_COMP may go into an OFF state. Accordingly, the first slew rate compensation circuit 420 may be activated and the second slew rate compensation circuit 430 may be inactivated. The first slew rate compensation circuit 420 may be activated to provide the first slew rate compensation current I_SR1 and the second slew rate compensation current I_SR2 to the load stage 200.

In another example, when a magnitude of the input voltage VIN becomes smaller than a value obtained by subtracting a threshold voltage of the PMOS transistor of the second comparator P_COMP from the magnitude of the output voltage VOUT, the first comparator N_COMP may go into an OFF state, and the second comparator P_COMP may go into an ON state. Accordingly, the first slew rate compensation circuit 420 may be inactivated and the second slew rate compensation circuit 430 may be activated. The second slew rate compensation circuit 430 may be activated to receive the first slew rate compensation current I_SR1 and the second slew rate compensation current I_SR2 from the load stage 200.

Meanwhile, unlike the PMOS transistor of the second comparator P_COMP, the NMOS transistor of the first comparator N_COMP may have a body connected in common with the source to receive the output voltage VOUT.

Referring to FIG. 5B, the NMOS transistor of the first comparator N_COMP may provide the same output voltage VOUT to the source and the body, so that the NMOS transistor of the first comparator N_COMP can use a threshold voltage of the transistor constantly even if a voltage of the body changes. When the body voltage of the NMOS transistor of the first comparator N_COMP is adjusted, the NMOS transistor must be separated into a deep N-well region, whereas the N-well of a PMOS transistor whose body voltage is the power supply voltage VDD can be used such that a layout area can be reduced. On the other hand, when the body voltage of the PMOS transistor of the second comparator P_COMP is adjusted, the N-well of a PMOS transistor whose body voltage is the power supply voltage VDD must be separated, thus the layout area may be increased. Accordingly, as described above, the NMOS transistor of the first comparator N_COMP may connect the body in common with the source, and the PMOS transistor of the second comparator P_COMP may not connect the body in common with the source.

Referring back to FIGS. 2 and 4A, the first slew rate compensation circuit 420 may be directly connected to a drain terminal of the first comparator N_COMP.

The first slew rate compensation circuit 420 may be connected to the load stage 200 to provide the first slew rate compensation current I_SR1 or the second slew rate compensation current I_SR2. The first slew rate compensation circuit 420 may include the first to third slew rate compensation PMOS transistors P_RB1, P_RB2, and P_RB3.

In an example, the first slew rate compensation circuit 420 may have the first slew rate compensation PMOS transistor P_RB1 connected to the comparator 410 and through which a first slew rate compensation reference current flows, and the second slew rate compensation PMOS transistor P_RB2 having a current mirror structure based on the first slew rate compensation PMOS transistor P_RB1 and through which the second slew rate compensation current I_SR2 flows, and the third slew rate compensation PMOS transistor P_RB3 having a current mirror structure based on the first slew rate compensation PMOS transistor P_RB1, having a parallel structure with the second slew rate compensation PMOS transistor P_RB2, and through which the first slew rate compensation current I_SR1 flows.

Specifically, the first slew rate compensation PMOS transistor P_RB1 of the first slew rate compensation circuit 420 may have a gate directly connected to the first comparator N_COMP, a drain connected in common with the gate, and a source connected to the power supply voltage VDD.

The second slew rate compensation PMOS transistor P_RB2 may have a gate having a mirror structure based on the first slew rate compensation PMOS transistor P_RB1, and connected in common with the gate of the first slew rate compensation PMOS transistor P_RB1, a drain connected to the third node ND3 of the third output terminal of the second differential mirror circuit 220, and a source connected to the power supply voltage VDD.

The third slew rate compensation PMOS transistor P_RB3 may have a gate having a mirror structure based on the first slew rate compensation PMOS transistor P_RB1, and connected in common with the gate of the first slew rate compensation PMOS transistor P_RB1, a drain connected to the first node ND1 of the first output terminal of the first differential mirror circuit 210, and a source connected to the power supply voltage VDD.

The first slew rate compensation reference current may flow through the first slew rate compensation PMOS transistor P_RB1. Accordingly, the second slew rate PMOS transistor P_RB2 may mirror the first slew rate compensation reference current to allow the second slew rate compensation current I_SR2 to flow through the second slew rate PMOS transistor P_RB2, and the second slew rate compensation current I_SR2 may be provided to the third node ND3 of the load stage 200.

The first slew rate compensation current I_SR1 may flow through the third slew rate compensation PMOS transistor P_RB3 by mirroring the first slew rate compensation reference current, and the first slew rate compensation current I_SR1 may be provided to the first node ND1 of the load stage 200.

The second slew rate compensation circuit 430 may be directly connected to a drain terminal of the second comparator P_COMP.

The second slew rate compensation circuit 430 is connected to the load stage 200 to receive the first slew rate compensation current I_SR1 or the second slew rate compensation current I_SR2 from the load stage 200. The second slew rate compensation circuit 430 may include the first to third slew rate compensation NMOS transistors N_FB1, N_FB2, and N_FB3.

The second slew rate compensation circuit 430 may have the first slew rate compensation NMOS transistor N_FB1 connected to the comparator 410 and through which a second slew rate compensation reference current flows, and the second slew rate compensation NMOS transistor N_FB2 having a current mirror structure based on the first slew rate compensation NMOS transistor N_FB1 and through which the first slew rate compensation current I_SR1 flows, and the third slew rate compensation NMOS transistor N_FB3 having a current mirror structure based on the first slew rate compensation NMOS transistor N_FB1, having a parallel structure with the second slew rate compensation NMOS transistor N_FB2, and through which the second slew rate compensation current I_SR2 flows.

Specifically, the first slew rate compensation NMOS transistor N_FB1 of the second slew rate compensation circuit 430 may have a gate directly connected to the second comparator P_COMP, a drain connected in common with the gate, and a source connected to the ground voltage VSS.

The second slew rate compensation NMOS transistor N_FB2 may have a gate having a mirror structure based on the first slew rate compensation NMOS transistor N_FB1, and connected in common with a gate of the first slew rate compensation NMOS transistor N_FB1, the drain connected to the first node ND1 of the first output terminal of the first differential mirror circuit 210, and a source connected to the ground voltage VSS.

The third slew rate compensation NMOS transistor N_FB3 may have a gate having a mirror structure based on the first slew rate compensation NMOS transistor N_FB1, and connected in common with the gate of the first slew rate compensation NMOS transistor N_FB1, a drain connected to the third node ND3 of the third output terminal of the second differential mirror circuit 220, and a source connected to the ground voltage VSS.

The second slew rate compensation reference current may flow through the first slew rate compensation NMOS transistor N_FB1. Accordingly, the second slew rate compensation NMOS transistor N_FB2 may mirror the second slew rate compensation reference current to allow the first slew rate compensation current I_SR1 to flow through the second slew rate compensation NMOS transistor N_FB2, and receive the first slew rate compensation current I_SR1 from the first node ND1 of the load stage 200.

The third slew rate compensation NMOS transistor N_FB3 may mirror the second slew rate compensation reference current to allow the second slew rate compensation current I_SR2 to flow through the third slew rate compensation NMOS transistor N_FB3, and receive the second slew rate compensation current I_SR2 from the third node ND3 of the load stage 200.

In an example, the first slew rate compensation current I_SR1 and the second slew rate compensation current I_SR2 may have the same magnitude.

The output stage 300 may include the first and second output transistors P_O1 and N_O1 and the first and second compensation capacitors C1 and C2.

The first output transistor P_O1 may have a gate connected to the fifth node ND5 of the first differential mirror circuit 210 of the load stage 200, a source connected to the power supply voltage VDD, and a drain connected to the output voltage VOUT. A current flowing through the first output transistor P_O1 may vary based on the voltage of the fifth node ND5 connected to a gate of the first output transistor P_O1.

The second output transistor N_O1 may have a gate connected to the sixth node ND6 of the second differential mirror circuit 220 of the load stage 200, a source connected to the ground voltage VSS, and a drain connected to the output voltage VOUT. A current flowing through the second output transistor N_O1 may vary based on the voltage of the sixth node ND6 connected to a gate of the second output transistor N_O1.

When the gate voltages of the first and second output transistors P_O1 and N_O1 increase, the output voltage VOUT of the output stage 300 may decrease. On the other hand, when the gate voltages of the first and second output transistors P_O1 and N_O1 of the output stage 300 decrease, the output voltage VOUT of the output stage 300 may increase.

Specifically, in an example, when the gate voltage of the first output transistor P_O1 decreases, the current flowing through the first output transistor P_O1 that is a PMOS transistor may increase. Accordingly, a current flowing from the power supply voltage VDD to the output terminal through the first output transistor P_O1 may increase. On the other hand, when the gate voltage of the second output transistor N_O1 decreases, the current flowing through the second output transistor N_O1 that is an NMOS transistor may decrease. Accordingly, a current flowing from the output terminal to the ground voltage VSS through the second output transistor N_O1 may decrease. Accordingly, since the current flowing from the power supply voltage VDD to the output terminal increases and the current flowing from the output terminal to the ground voltage VSS decreases, the output voltage VOUT at the output terminal may increase.

In another example, when the gate voltage of the first output transistor P_O1 increases, the current flowing through the first output transistor P_O1 that is a PMOS transistor may decrease. Accordingly, the current flowing from the power supply voltage VDD to the output terminal through the first output transistor P_O1 may decrease. On the other hand, when the gate voltage of the second output transistor N_O1 increases, the current flowing through the second output transistor N_O1 that is an NMOS transistor may increase. Accordingly, the current flowing from the output terminal to the ground voltage VSS through the second output transistor N_O1 may increase. Accordingly, since the current flowing from the power supply voltage VDD to the output terminal decreases and the current flowing from the output terminal to the ground voltage VSS increases, the output voltage VOUT at the output terminal may decrease.

The first compensation capacitor C1 may have one end connected to the output voltage VOUT and the other end connected to the second node ND2 of the first differential mirror circuit 210. The second compensation capacitor C2 may have one end connected to the output voltage VOUT and the other end connected to the fourth node ND4 of the second differential mirror circuit 220. The slew rate of the output voltage VOUT according to the input voltage VIN may increase or decrease based on a charge rate and a discharge rate of the first compensation capacitor C1 and the second compensation capacitor C2.

The following describes a slew rate compensating operation using the slew rate compensator 400 according to one or more embodiments of the present disclosure. A slew rate compensating operation, which rapidly increases the output voltage VOUT when the input voltage VIN increases, and a slew rate compensating operation, which rapidly decreases the output voltage VOUT when the input voltage VIN decreases, will be separately described.

Figure 6:
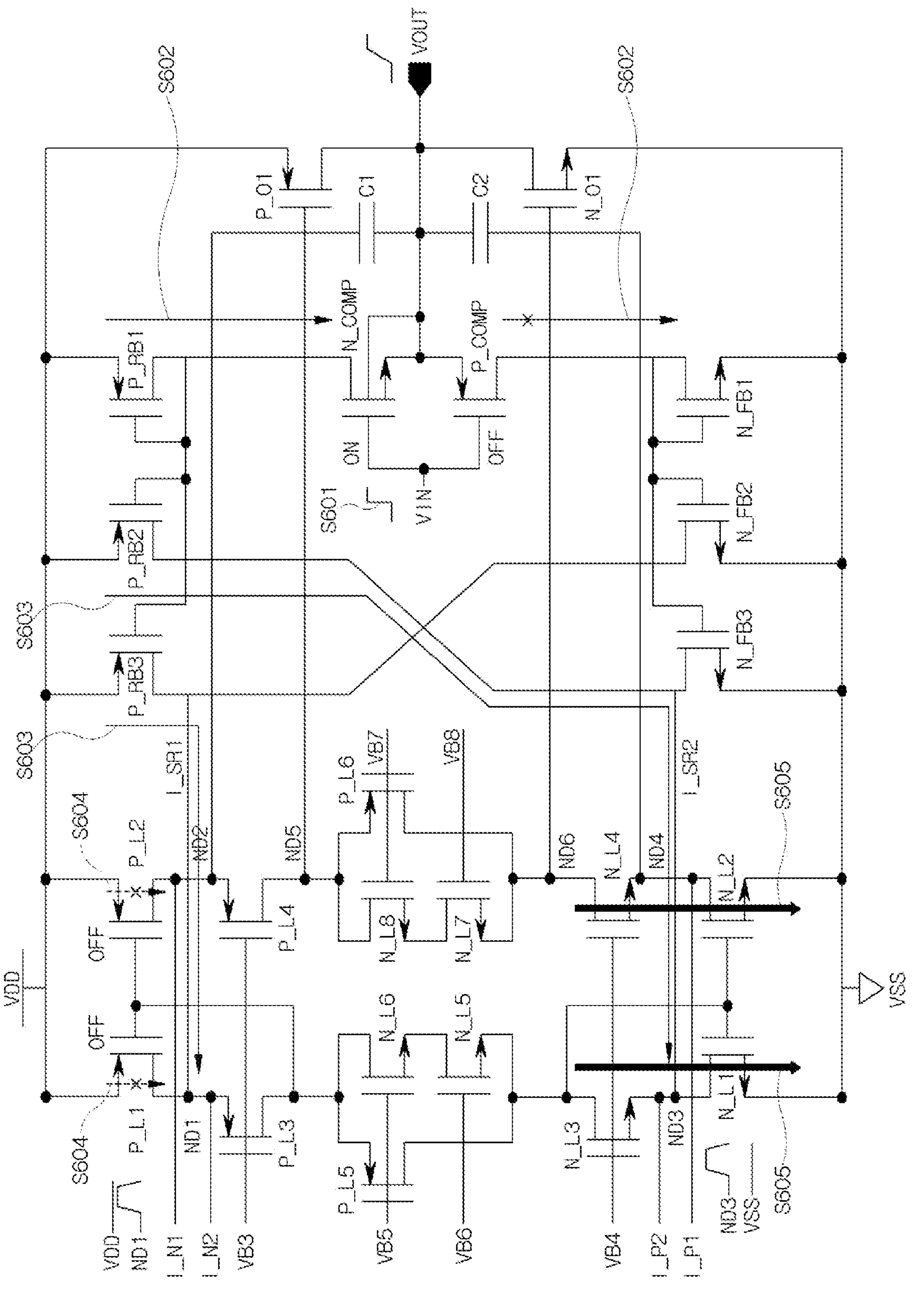
FIG. 6 illustrates a view showing a description of a method of operating a buffer circuit when an input voltage VIN increases according to one or more embodiments of the present disclosure.

First, with reference to FIG. 6, the slew rate compensating operation for quickly increasing the output voltage VOUT when the input voltage VIN increases will be described.

In step S601, a magnitude difference between the input voltage VIN and the output voltage VOUT may be compared. When the input voltage VIN changes to 'H' (e.g., VDD) in a state where the input voltage VIN and the output voltage VOUT are 'L' (e.g., VSS), a time point occurs when a magnitude of the input voltage VIN is greater than or equal to a value obtained by adding a magnitude of the output voltage VOUT to a threshold voltage of the first comparator N_COMP, and at this time, the first comparator N_COMP may go into an ON state, and the second comparator P_COMP may go into an OFF state. Accordingly, the first slew rate compensation circuit 420 may be activated and the second slew rate compensation circuit 430 may be inactivated.

In step S602, when the first slew rate compensation circuit 420 is activated, a current may flow from the first slew rate compensation PMOS transistor P_RB1 included in the first slew rate compensation circuit 420 to the first comparator N_COMP. A current flowing through the first slew rate compensation PMOS transistor P_RB1 may be the first slew rate compensation reference current. On the other hand, when the second slew rate compensation circuit 430 is inactivated, a current flowing from the second comparator P_COMP to the first slew rate compensation NMOS transistor N_FB1 included in the second slew rate compensation circuit 430 may be blocked.

In step S603, the first slew rate compensation circuit 420 may mirror the first slew rate compensation reference current flowing through a first slew rate compensation reference current branch to which the first slew rate compensation PMOS transistor P_RB1 is connected into a branch to which the second slew rate compensation PMOS transistor P_RB2 is connected. Accordingly, a first mirror current obtained by mirroring the first slew rate compensation reference current may flow to the branch to which the second slew rate compensation PMOS transistor P_RB2 is connected. Here, the first mirror current may be referred to as the second slew rate compensation current I_SR2. The second slew rate compensation current I_SR2 may be provided to the load stage 200. The second slew rate compensation current I_SR2 may be provided to the third output terminal where the third node ND3 of the second differential mirror circuit 220 of the load stage 200 is located.

In addition, the first slew rate compensation circuit 420 may mirror the first slew rate compensation reference current flowing in the first slew rate compensation reference current branch to which the first slew rate compensation PMOS transistor P_RB1 is connected into a branch to which the third slew rate compensation PMOS transistor P_RB3 is connected. Accordingly, a second mirror current obtained by mirroring the first slew rate compensation reference current may flow in the branch to which the third slew rate compensation PMOS transistor P_RB3 is connected. Here, the second mirror current may be referred to as the first slew rate compensation current I_SR1. The first slew rate compensation current I_SR1 may be provided to the load stage 200. The first slew rate compensation current I_SR1 may be provided to the first output terminal where the first node ND1 of the first differential mirror circuit 210 of the load stage 200 is located.

In step S604, when the first slew rate compensation current I_SR1 is provided to the first node ND1 of the first output terminal of the first differential mirror circuit 210, a voltage of the first node ND1 may instantaneously rise by the first slew rate compensation current I_SR1. A time point occurs when the rising voltage of the first node ND1 approaches the power supply voltage VDD, and a difference between the two voltages becomes lower than a threshold voltage of the first load stage PMOS transistor P_L1 of the first differential mirror circuit 210. At this time, an operation of the first load stage PMOS transistor P_L1 may be turned off. When the operation of the first load stage PMOS transistor P_L1 is turned off, a current does not flow in a branch to which the first load stage PMOS transistor P_L1 is connected. Also, a current may not flow in the branch to which the second load stage PMOS transistor P_L2 having a mirror structure is connected.

Step S605 may proceed in parallel or concurrently with step S604. In step S605, when the second slew rate compensation current I_SR2 is provided to the third node ND3 of the third output terminal of the second differential mirror circuit 220, a voltage of the third node ND3 may instantaneously rise by the second slew rate compensation current I_SR2. A time point occurs when the rising voltage of the third node ND3 becomes higher than a ground voltage VSS and a difference between the two voltages exceeds a threshold voltage of the first load stage NMOS transistor N_L1. At this time, the first load stage NMOS transistor N_L1 may be in an ON state. When the first load stage NMOS transistor N_L1 is in an ON state, a reference current may flow in a branch to which the first load stage NMOS transistor N_L1 is connected. In addition, the second compensation mirror current obtained by mirroring a reference current may flow in a branch to which the second load stage NMOS transistor N_L2 is connected.

The first slew rate compensation circuit 420 may provide the second slew rate compensation current I_SR2 to the third node ND3 to which the third output terminal which is an opposite terminal of the mirror structure is connected, instead of directly providing it to the fourth output terminal where the fourth node ND4 connected to the second compensation capacitor C2 is located, or a sixth node ND6 connected to the second output transistor N_O1. That is, the first slew rate compensation circuit 420 directly provides the second slew rate compensation current I_SR2 to the third node ND3 to which the third output terminal is connected, and indirectly provides the second compensation mirror current obtained by mirroring the second slew rate compensation current I_SR2 to the fourth node ND4 or the sixth node ND6. In the course of generating the target compensation current and directly supplying the compensation current to the output transistor, the process or temperature changes may affect the course, but the second compensation mirror current obtained by mirroring the reference current is less affected by the process or temperature changes and a degree of improvement of the slew rate may be increased.

In step S606 (not illustrated), the second load stage PMOS transistor P_L2 of the first differential mirror circuit 210 goes into an OFF state, and may not supply a current in a direction of the second node ND2 and the voltage of the second node ND2 may decrease. Also, since a current is not supplied to the fifth node ND5, the voltage of the fifth node ND5 may decrease.

On the other hand, the second load stage NMOS transistor N_L2 of the second differential mirror circuit 220 goes into an ON state, a current may be supplied from the fourth node ND4 in a direction of the ground voltage VSS, and the voltage of the fourth node ND4 may rapidly decrease. In addition, the voltage of the sixth node ND6 may be reduced as the sixth node ND6 supplies a current.

Accordingly, the voltage of the second node ND2, the voltage of the fourth node ND4, the voltage of the fifth node ND5 connected to the gate of the first output transistor P_O1, and the voltage of the sixth node ND6 connected to the gate of the second output transistor N_O1 may all decrease.

When the gate voltage of the first output transistor P_O1 decreases, the current flowing through the first output transistor P_O1 that is a PMOS transistor may increase. Accordingly, the current flowing from the power supply voltage VDD to the output terminal through the first output transistor P_O1 may increase. On the other hand, when the gate voltage of the second output transistor N_O1 decreases, the current flowing through the second output transistor N_O1 that is an NMOS transistor may decrease. Accordingly, the current flowing from the output terminal to the ground voltage VSS through the second output transistor N_O1 may decrease. Accordingly, since the current flowing from the power supply voltage VDD to the output terminal increases more, and the current flowing from the output terminal to the ground voltage VSS decreases more, the output voltage VOUT rapidly increases at the output terminal and may follow the input voltage. That is, the slew rate of the output voltage VOUT with respect to the rising transition of the input voltage VIN may be improved.

Figure 7:
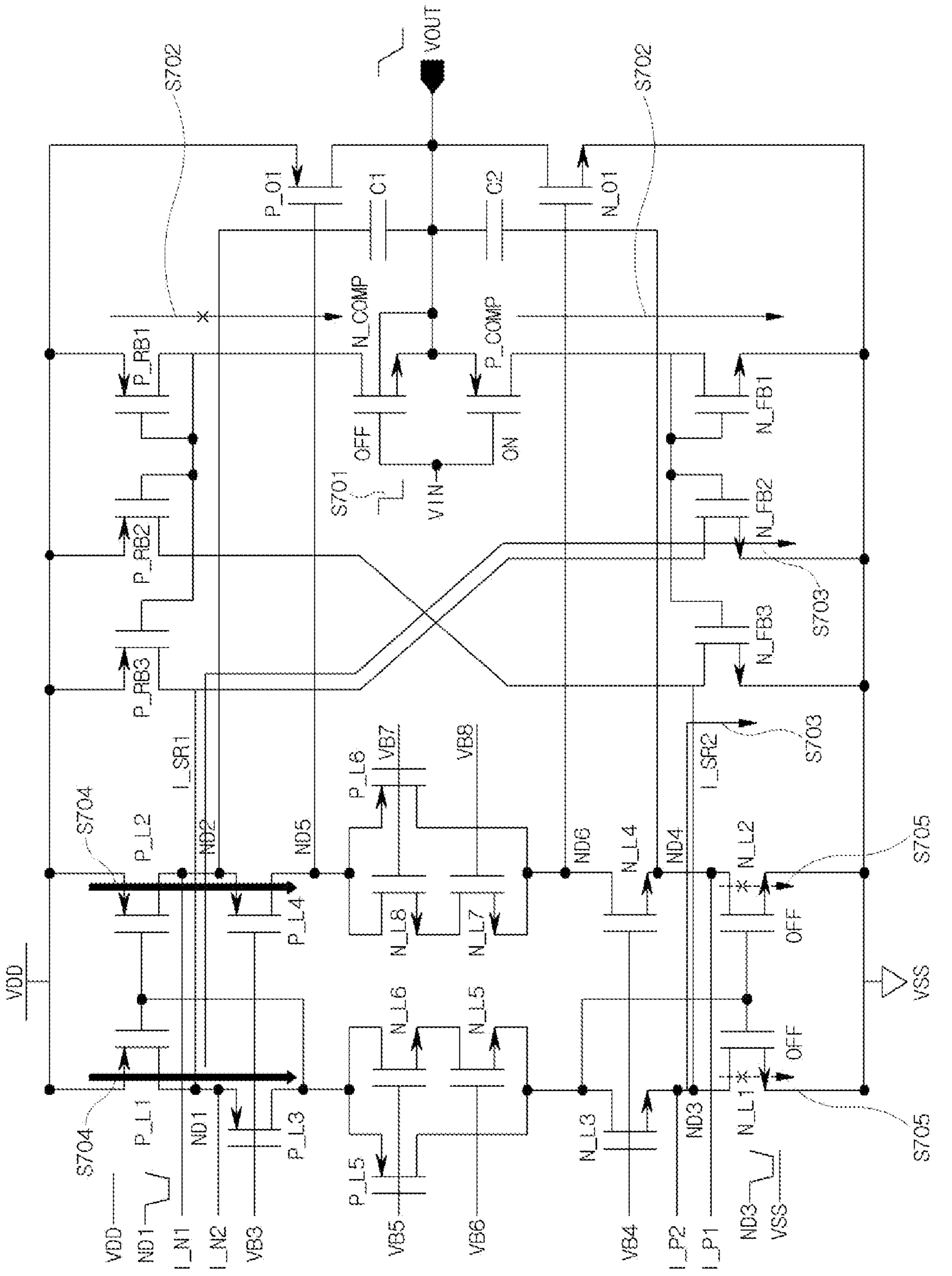
FIG. 7 illustrates a view showing a description of a method of operating a buffer circuit when the input voltage VIN decreases according to one or more embodiments of the present disclosure.

Next, referring to FIG. 7, a slew rate compensation operation in which the output voltage VOUT rapidly decreases when the input voltage VIN decreases will be described.

In step S701, the magnitude difference between the input voltage VIN and the output voltage VOUT may be compared. When the input voltage VIN changes to 'L (e.g., VSS)' in a state where the input voltage VIN and the output voltage VOUT are identically 'H (e.g., VDD)', a time point occurs when a magnitude of the input voltage VIN is smaller than or equal to a value obtained by subtracting a threshold voltage of the second comparator P_COMP from a magnitude of the output voltage VOUT, and at this time, the first comparator N_COMP may be in an OFF state, the second comparator P_COMP may be in an ON state. Accordingly, the second slew rate compensation circuit 430 may be activated and the first slew rate compensation circuit 420 may be inactivated.

In step 702, when the second slew rate compensation circuit 430 is activated, a current may flow from a second comparator P_COMP to the first slew rate compensation NMOS transistor N_FB1 included in the second slew rate compensation circuit 430. A current flowing through the first slew rate compensation NMOS transistor N_FB1 may be the second slew rate compensation reference current. On the other hand, when the first slew rate compensation circuit 420 is inactivated, a current flowing from the first slew rate compensation PMOS transistor P_RB1 included in the first slew rate compensation circuit 420 to the first comparator N_COMP may be blocked.

In step S703, the second slew rate compensation circuit 430 may mirror the second slew rate compensation reference current flowing through the second slew rate compensation reference current branch to which the first slew rate compensation NMOS transistor N_FB1 is connected into the second slew rate compensation NMOS transistor N_FB2. Accordingly, the first mirror current obtained by mirroring the second slew rate compensation reference current may flow through a branch to which the second slew rate compensation NMOS transistor N_FB2 is connected. Here, the first mirror current may be referred to as the first slew rate compensation current I_SR1. The second slew rate compensation NMOS transistor N_FB2 may receive the first slew rate compensation current I_SR1 from the load stage 200. The second slew rate compensation NMOS transistor N_FB2 may receive the first slew rate compensation current I_SR1 from the first output terminal where the first node ND1 of the first differential mirror circuit 210 of the load stage 200 is located.

In addition, the second slew rate compensation circuit 430 may mirror the second slew rate compensation reference current flowing through the second slew rate compensation reference current branch to which the first slew rate compensation NMOS transistor N_FB1 is connected into a branch to which the third slew rate compensation NMOS transistor N_FB3 is connected. Accordingly, the second mirror current obtained by mirroring the second slew rate compensation reference current may flow through a branch to which the third slew rate compensation NMOS transistor N_FB3 is connected. Here, the second mirror current may be referred to as the second slew rate compensation current I_SR2. The third slew rate compensation NMOS transistor N_FB3 may receive the second slew rate compensation current I_SR2 from the load stage 200. The third slew rate compensation NMOS transistor N_FB3 may receive the second slew rate compensation current I_SR2 from the third output terminal where the third node ND3 of the second differential mirror circuit 220 of the load stage 200 is located.

In step S704, when the second slew rate compensation NMOS transistor N_FB2 of the second slew rate compensation circuit 430 receives the first slew rate compensation current I_SR1 from the first node ND1 located at the first output terminal of the first differential mirror circuit 210, the voltage of the first node ND1 may fall instantaneously. A time point occurs when the fallen voltage of the first node ND1 becomes lower than the power supply voltage VDD, and a difference between the two voltages exceeds the threshold voltage of the first load stage PMOS transistor P_L1. At this time, the first load stage PMOS transistor P_L1 may be in an ON state. When the first load stage PMOS transistor P_L1 is in an ON state, the reference current may flow through the branch to which the first load stage PMOS transistor P_L1 is connected. Also, the first compensation mirror current obtained by mirroring the reference current may flow through the branch to which the second load stage PMOS transistor P_L2 is connected.

Step S705 may proceed in parallel or concurrently with step S704. In step S705, the third slew rate compensation NMOS transistor N_FB3 of the second slew rate compensation circuit 430 may receive the second slew rate compensation current I_SR2 from the third output terminal where the third node ND3 of the second differential mirror circuit 220 is located. The voltage of the third node ND3 may drop immediately by providing the second slew rate compensation current I_SR2. A time point occurs when the voltage of the third node ND3 comes close to the ground voltage VSS, and a difference between the two voltages becomes lower than the threshold voltage of the first load stage NMOS transistor N_L1. At this time, an operation of the first load stage NMOS transistor N_L1 may be turned off. When the operation of the first load stage NMOS transistor N_L1 is turned off, a current may not flow through the branch to which the first load stage NMOS transistor N_L1 is connected, and may not flow through the branch to which the second load stage NMOS transistor N_L2 having a mirror structure is connected.

The second slew rate compensation circuit 430 may receive the first slew rate compensation current I_SR1 from the first node ND1 to which the first output terminal which is an opposite terminal of the mirror structure is connected, instead of directly receiving it from the second output terminal where the second node ND2 connected to the first compensation capacitor C1 is located, or the fifth node ND5 connected to the first output transistor P_O1. That is, the second slew rate compensation circuit 430 directly receives the first slew rate compensation current I_SR1 from the first node ND1 to which the first output terminal is connected, and indirectly receives the first compensation mirror current obtained by mirroring from the second node ND2 or the fifth node ND5. In the course of generating the target compensation current and directly providing the compensation current to the output transistor, the process or temperature changes may affect the course, but the first compensation mirror current obtained by mirroring the reference current is less affected by the process or temperature changes and a degree of improvement of the slew rate may be increased.

In step S706 (not illustrated), the second load stage PMOS transistor P_L2 of the first differential mirror circuit 210 is in an ON state, a current may be supplied in the direction of the second node ND2, and the voltage of the second node ND2 may rise rapidly. Also, a current is supplied to the fifth node ND5 so that the voltage of the fifth node ND5 can increase.

On the other hand, the second load stage NMOS transistor N_L2 of the second differential mirror circuit 220 is in an OFF state so that a current flowing in the direction of the ground voltage VSS at the fourth node ND4 may be blocked, and the voltage of the fourth node ND4 may increase. Also, since the sixth node ND6 does not supply a current, the voltage of the sixth node ND6 may increase.

Accordingly, the voltages of the second node ND2, the fourth node ND4, the fifth node ND5 connected to the gate of the first output transistor P_O1, and the sixth node ND6 connected to the gate of the second output transistor N_O1 may all increase.

When the gate voltage of the first output transistor P_O1 increases, the current flowing through the first output transistor P_O1 that is a PMOS transistor may decrease. Accordingly, the current flowing from the power supply voltage VDD to the output terminal through the first output transistor P_O1 may decrease. On the other hand, when the gate voltage of the second output transistor N_O1 increases, the current flowing through the second output transistor N_O1, which is an NMOS transistor, may increase. Accordingly, the current flowing from the output terminal to the ground voltage VSS through the second output transistor N_O1 may increase. Accordingly, since the current flowing from the power supply voltage VDD to the output terminal decreases faster and the current flowing from the output terminal to the ground voltage VSS increases faster, the output voltage VOUT at the output terminal decreases faster and may follow the input voltage. That is, the slew rate of the output voltage VOUT with respect to the falling transition of the input voltage VIN may be improved.

The following describes the effects of the slew rate compensator 400 according to one or more embodiments of the present disclosure.

Figure 8:
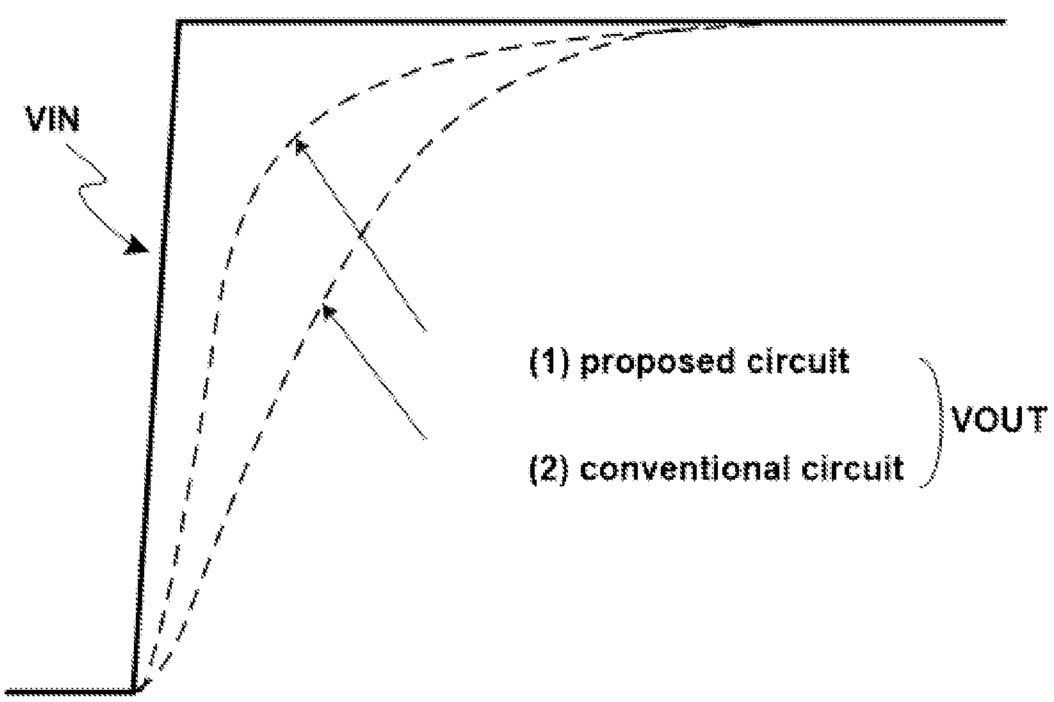
FIG. 8 illustrates a view showing an effect of a buffer circuit according to one or more embodiments of the present disclosure.

Referring to FIG. 8, when the slew rate compensator 400 according to one or more embodiments of the present disclosure is not applied, the slew rate may be low because the output voltage VOUT does not quickly follow the input voltage VIN. (Refer to (2) in FIG. 8).

On the other hand, when the slew rate compensator 400 according to one or more embodiments of the present disclosure is applied, the output voltage VOUT may quickly follow the input voltage VIN so that the difference between the input voltage VIN and output voltage VOUT can come quickly close to a threshold voltage of the MOS transistor, thereby increasing the slew rate (Refer to (1) in FIG. 8).

As described above, the buffer circuit according to one or more embodiments of the present disclosure may provide a buffer circuit with a high slew rate, reduced layout area and low power consumption. In addition, it is possible to provide a buffer circuit with a high slew rate that rises or falls quickly, by generating and providing two compensation currents to the first and second differential mirror circuits of the load stage at the same time to simultaneously increase or decrease the gate voltages of the first and second transistors of the output stage so that the output voltage follows the input voltage.

In addition, instead of directly providing the compensation current to the output transistor or the compensation capacitor, by indirectly providing the compensation mirror current obtained by mirroring, which is less affected by a process or temperature change, the degree of improvement of the slew rate may be increased.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A buffer circuit that generates an output voltage based on an input voltage, comprising:

an input stage configured to provide a differential current to a load stage based on a difference between the input voltage and the output voltage;

the load stage configured to apply gate voltages to output transistors of an output stage based on the differential current;

the output stage configured to regulate the output voltage based on the gate voltages applied to the output transistors; and a slew rate compensator configured to provide or receive a first slew rate compensation current and a second slew rate compensation current to or from the load stage, wherein the slew rate compensator comprises a first slew rate compensation circuit including first to third slew rate compensation PMOS transistors only, each of the second and third slew rate compensation PMOS transistors having a current mirror structure based on the first slew rate compensation PMOS transistor, and a second slew rate compensation circuit including first to third slew rate compensation NMOS transistors only, each of the second and third slew rate compensation NMOS transistors having a current mirror structure based on the first slew rate compensation NMOS transistor, wherein the first slew rate compensation circuit is configured to provide the first slew rate compensation current and the second slew rate compensation current to the load stage, and the second slew rate compensation circuit is configured to receive the first slew rate compensation current and the second slew rate compensation current from the load stage, wherein the second slew rate compensation PMOS or NMOS transistor provides or receives a current mirror-based compensation current to or from the load stage, and wherein the load stage comprises:

a first differential mirror circuit having a first current mirror structure and a cascode structure and configured to mirror the differential current generated by the difference between the input voltage and the output voltage and the first slew rate compensation current; and a second differential mirror circuit having a second current mirror structure and a cascode structure and configured to mirror the differential current and the second slew rate compensation current.

2. The buffer circuit of claim 1, wherein the slew rate compensator comprises a comparator configured to compare the difference between the input voltage and the output voltage and go into an ON or OFF state based on the difference between the input voltage and the output voltage.

3. The buffer circuit of claim 2, wherein the first slew rate compensation PMOS transistor is connected to the comparator and is configured to allow a first slew rate compensation reference current to flow therein, and wherein the third slew rate compensation PMOS transistor has a parallel structure with the second slew rate compensation PMOS transistor.

4. The buffer circuit of claim 3, wherein the first slew rate compensation PMOS transistor has a gate connected to the comparator, a drain connected to the comparator in common with the gate, and a source connected to a power supply voltage;

wherein the second slew rate compensation PMOS transistor has a gate connected to the comparator in common with the gate of the first slew rate compensation PMOS transistor, a drain connected to a third node of a third output terminal of a second differential mirror circuit of the load stage, and a source connected to the power supply voltage, and wherein the third slew rate compensation PMOS transistor has a gate connected to the comparator in common with the gate of the first slew rate compensation PMOS transistor, a drain connected to a first node of a first output terminal of a first differential mirror circuit of the load stage, and a source connected to the power supply voltage.

5. The buffer circuit of claim 3, wherein the first slew rate compensation circuit mirrors the first slew rate compensation reference current flowing in a branch to which the first slew rate compensation PMOS transistor is connected into a branch to which the third slew rate compensation PMOS transistor is connected to provide the first slew rate compensation current to the load stage, and wherein the first slew rate compensation circuit mirrors the first slew rate compensation reference current flowing in the branch to which the first slew rate compensation PMOS transistor is connected into a branch to which the second slew rate compensation PMOS transistor is connected to provide the second slew rate compensation current to the load stage.

6. The buffer circuit of claim 2, wherein the first slew rate compensation NMOS transistor is connected to the comparator and is configured to allow a second slew rate compensation reference current to flow therein, and wherein the third slew rate compensation NMOS transistor has a parallel structure with the second slew rate compensation NMOS transistor.

7. The buffer circuit of claim 6, wherein the first slew rate compensation NMOS transistor has a gate connected to the comparator, a drain connected to the comparator in common with the gate, and a source connected to a ground voltage, wherein the second slew rate compensation NMOS transistor has a gate connected to the comparator in common with the gate of the first slew rate compensation NMOS transistor, a drain connected to a first node of a first output terminal of a first differential mirror circuit of the load stage, and a source connected to the ground voltage, and wherein the third slew rate compensation NMOS transistor has a gate connected to the comparator in common with the gate of the first slew rate compensation NMOS transistor, a drain connected to a third node of a third output terminal of a second differential mirror circuit of the load stage, and a source connected to the ground voltage.

8. The buffer circuit of claim 6, wherein the second slew rate compensation circuit mirrors the second slew rate compensation reference current flowing in a branch to which the first slew rate compensation NMOS transistor is connected into a branch to which the second slew rate compensation NMOS transistor is connected to receive the first slew rate compensation current from the load stage, and wherein the second slew rate compensation circuit mirrors the second slew rate compensation reference current flowing in the branch to which the first slew rate compensation NMOS transistor is connected into a branch to which the third slew rate compensation NMOS transistor is connected to receive the second slew rate compensation current from the load stage.

9. The buffer circuit of claim 2, wherein the comparator comprises:

a first comparator comprising an NMOS transistor having a gate connected to the input voltage, a drain connected to the first slew rate compensation circuit, and a source connected to the output voltage; and a second comparator comprising a PMOS transistor having a gate connected to the input voltage, a drain connected to the second slew rate compensation circuit, and a source connected to the output voltage, and wherein the NMOS transistor of the first comparator has a body connected to the output voltage in common with the sources of the first comparator and the second comparator.

10. The buffer circuit of claim 1, wherein the load stage further comprises:

a third bias circuit and a fourth bias circuit connected between the first differential mirror circuit and the second differential mirror circuit to control an operation in a static state and an amplification operation of the first differential mirror circuit and the second differential mirror circuit.

11. The buffer circuit of claim 10, wherein the first differential mirror circuit comprises:

first and second load stage PMOS transistors configured to perform a current mirroring operation, and third and fourth load stage PMOS transistors connected in series to the first and second load stage PMOS transistors, respectively, to form a cascode structure, wherein the first load stage PMOS transistor has a gate connected to the third bias circuit in common with a gate of the second load stage PMOS transistor, a drain connected to a first output terminal where a first node is located, and a source connected to a power supply voltage, wherein the second load stage PMOS transistor has a gate connected to the third bias circuit in common with the gate of the first load stage PMOS transistor, a drain connected to a second output terminal where a second node is located, and a source connected to the power supply voltage, wherein the third load stage PMOS transistor has a gate connected to a third bias voltage, a drain connected to the third bias circuit, and a source connected to the first output terminal where the first node is located, and wherein the fourth load stage PMOS transistor has a gate connected to the third bias voltage, a drain connected to the fourth bias circuit, and a source connected to the second output terminal where the second node is located.

12. The buffer circuit of claim 11, wherein the first differential mirror circuit is configured to receive the first slew rate compensation current at the first node from the slew rate compensator, or provide the first slew rate compensation current from the first node to the slew rate compensator.

13. The buffer circuit of claim 10, wherein the second differential mirror circuit comprises:

first and second load stage NMOS transistors configured to perform a current mirroring operation; and third and fourth load stage NMOS transistors connected in series to the first and second load stage NMOS transistors, respectively, to form a cascode structure, wherein the first load stage NMOS transistor has a gate connected to the third bias circuit in common with the second load stage NMOS transistor, a drain connected to a third output terminal where a third node is located, and a source connected to a ground voltage, wherein the second load stage NMOS transistor has a gate connected to the third bias circuit in common with the first load stage NMOS transistor, a drain connected to a fourth output terminal where a fourth node is located, and a source connected to the ground voltage, wherein the third load stage NMOS transistor has a gate connected to a fourth bias voltage, a drain connected to the third bias circuit, and a source connected to the third output terminal where the third node is located, and wherein the fourth load stage NMOS transistor has a gate connected to the fourth bias voltage, a drain connected to the fourth bias circuit, and a source connected to the fourth output terminal where the fourth node is located.

14. The buffer circuit of claim 13, wherein the second differential mirror circuit is configured to receive the second slew rate compensation current at the third node from the slew rate compensator or provide the second slew rate compensation current from the third node to the slew rate compensator.

15. A method of controlling a buffer circuit as defined in claim 1, the method comprising:

comparing the input voltage and the output voltage;

providing or receiving the first and second slew rate compensation currents to or from the load stage using transistors configured in a current mirror structure, wherein the second slew rate compensation PMOS or NMOS transistor mirrors a reference current of the first slew rate compensation PMOS or NMOS transistor; and driving the load stage and output stage such that the output voltage follows a transition of the input voltage.

16. The method of claim 15, further comprising:

providing the first and second slew rate compensation currents to the load stage in response to the input voltage exceeding a value obtained by adding the threshold voltage of the MOS transistor to the output voltage;

switching the first differential mirror circuit to an OFF state so that the first compensation mirror current does not flow, and switching the second differential mirror circuit to an ON state so that the second compensation mirror current flows based on the first slew rate compensation current and the second slew rate compensation current;

decreasing the gate voltages of the first and second output transistors based on the first compensation mirror current and the second compensation mirror current; and allowing the output voltage to increase and follow a rising transition of the input voltage in response to a decrease in the gate voltages of the first and second output transistors.

17. The method of claim 15, further comprising:

receiving the first slew rate compensation current and the second slew rate compensation current from the load stage when the input voltage becomes lower than a value obtained by subtracting the threshold voltage of the MOS transistor from the output voltage;

switching the first differential mirror circuit to an ON state so that the first compensation mirror current flows, and switching the second differential mirror circuit to an OFF state so that the second compensation mirror current does not flow based on the first slew rate compensation current and the second slew rate compensation current;

increasing the gate voltages of the first and second output transistors based on the first compensation mirror current and the second compensation mirror current; and allowing the output voltage to decrease and follow a falling transition of the input voltage in response to an increase in the gate voltages of the first and second output transistors.

18. A buffer circuit that generates an output voltage based on an input voltage, comprising:

an input stage configured to provide a differential current to a load stage based on a difference between the input voltage and the output voltage;

the load stage configured to apply gate voltages to output transistors of an output stage based on the differential current;

the output stage configured to regulate the output voltage based on the gate voltages applied to the output transistors; and a slew rate compensator configured to provide to or receive from the load stage a slew rate compensation current based on the difference between the input voltage and the output voltage, wherein the slew rate compensator further comprises:

a first comparator comprising an NMOS transistor having a gate coupled to the input voltage, a source and body coupled in common to the output voltage, and a drain coupled to a first slew rate compensation circuit; and a second comparator comprising a PMOS transistor having a gate coupled to the input voltage, a source coupled to the output voltage, and a drain coupled to a second slew rate compensation circuit, wherein the first slew rate compensation circuit comprises a first slew rate compensation PMOS transistor and a second slew rate compensation PMOS transistor having a current mirror structure based on the first slew rate compensation PMOS transistor and configured to provide a second slew rate compensation current to a third node, and comprises a third slew rate compensation PMOS transistor having the current mirror structure based on the first slew rate compensation PMOS transistor and configured to provide a first slew rate compensation current to a first node, and wherein the second slew rate compensation circuit comprise a first slew rate compensation NMOS transistor and a second slew rate compensation NMOS transistor having a current mirror structure based on the first slew rate compensation NMOS transistor and configured to receive the first slew rate compensation current from the first node, and comprises a third slew rate compensation NMOS transistor having the current mirror structure based on the first slew rate compensation NMOS transistor and configured to receive the second slew rate compensation current from the third node.

19. The buffer circuit of claim 18, wherein the first slew rate compensation circuit is configured to provide the first slew rate compensation current and the second slew rate compensation current to the load stage, and wherein the second slew rate compensation circuit is configured to receive the first slew rate compensation current and the second slew rate compensation current from the load stage.

* * * * *